US011641723B2

(12) United States Patent
Kobayashi et al.

(10) Patent No.: US 11,641,723 B2
(45) Date of Patent: May 2, 2023

(54) INPUT DEVICE AND COVER

(71) Applicant: Sony Interactive Entertainment Inc., Tokyo (JP)

(72) Inventors: Ikuo Kobayashi, Tokyo (JP); Masaho Morita, Tokyo (JP); Ryu Sannomiya, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 102 days.

(21) Appl. No.: 17/209,307

(22) Filed: Mar. 23, 2021

(65) Prior Publication Data

US 2021/0307188 A1  Sep. 30, 2021

(30) Foreign Application Priority Data

Mar. 31, 2020  (JP) .............................. JP2020-065102

(51) Int. Cl.
*A63F 13/24* (2014.01)
*H05K 5/03* (2006.01)

(52) U.S. Cl.
CPC .............. *H05K 5/03* (2013.01); *A63F 13/24* (2014.09)

(58) Field of Classification Search
CPC ....................................................... A63F 13/24
See application file for complete search history.

(56) References Cited

U.S. PATENT DOCUMENTS

| | | | | |
|---|---|---|---|---|
| 5,419,613 | A | * | 5/1995 | Wedeking ................ A47C 7/72 248/205.2 |
| 9,789,395 | B2 | | 10/2017 | Igarashi |
| 2005/0174337 | A1 | * | 8/2005 | Nielsen ............... G06F 3/04892 345/173 |
| 2007/0202956 | A1 | * | 8/2007 | Ogasawara ........... G06F 1/1624 463/46 |
| 2008/0012962 | A1 | | 1/2008 | Terakado |
| 2008/0096657 | A1 | * | 4/2008 | Benoist ................. A63F 13/837 463/36 |
| 2015/0290534 | A1 | | 10/2015 | Igarashi |
| 2019/0217208 | A1 | * | 7/2019 | Hirose .................... A63F 13/98 |
| 2021/0197080 | A1 | * | 7/2021 | Su ........................... A63F 13/24 |
| 2021/0299552 | A1 | * | 9/2021 | Morita ..................... H04R 1/08 |
| 2021/0299554 | A1 | * | 9/2021 | Kobayashi ............. G06F 3/016 |

FOREIGN PATENT DOCUMENTS

| | | |
|---|---|---|
| EP | 2908224 A1 | 8/2015 |
| WO | 2014061322 A1 | 4/2014 |
| WO | 2018229466 A1 | 12/2018 |

OTHER PUBLICATIONS

Extended Search Report for corresponding EP Application 21165210.2, 9 pages, dated Aug. 8, 2021.

* cited by examiner

*Primary Examiner* — Hung V Ngo
(74) *Attorney, Agent, or Firm* — Matthew B. Dernier, Esq.

(57) ABSTRACT

Disclosed herein is an input device including: a cabinet including an upper cabinet section and a lower cabinet section that are combined in an upward-downward direction; at least one fixture fixing the upper cabinet section to the lower cabinet section; and a cover attached to an exterior surface of the cabinet to cover the at least one fixture. The exterior surface of the cabinet has an exposed region adjacent to the cover and not covered by the cover. A step is formed between the exposed region of the exterior surface of the cabinet and an exterior surface of the cover, so that the exterior surface of the cover is recessed with respect to the exposed region of the exterior surface of the cabinet.

13 Claims, 31 Drawing Sheets

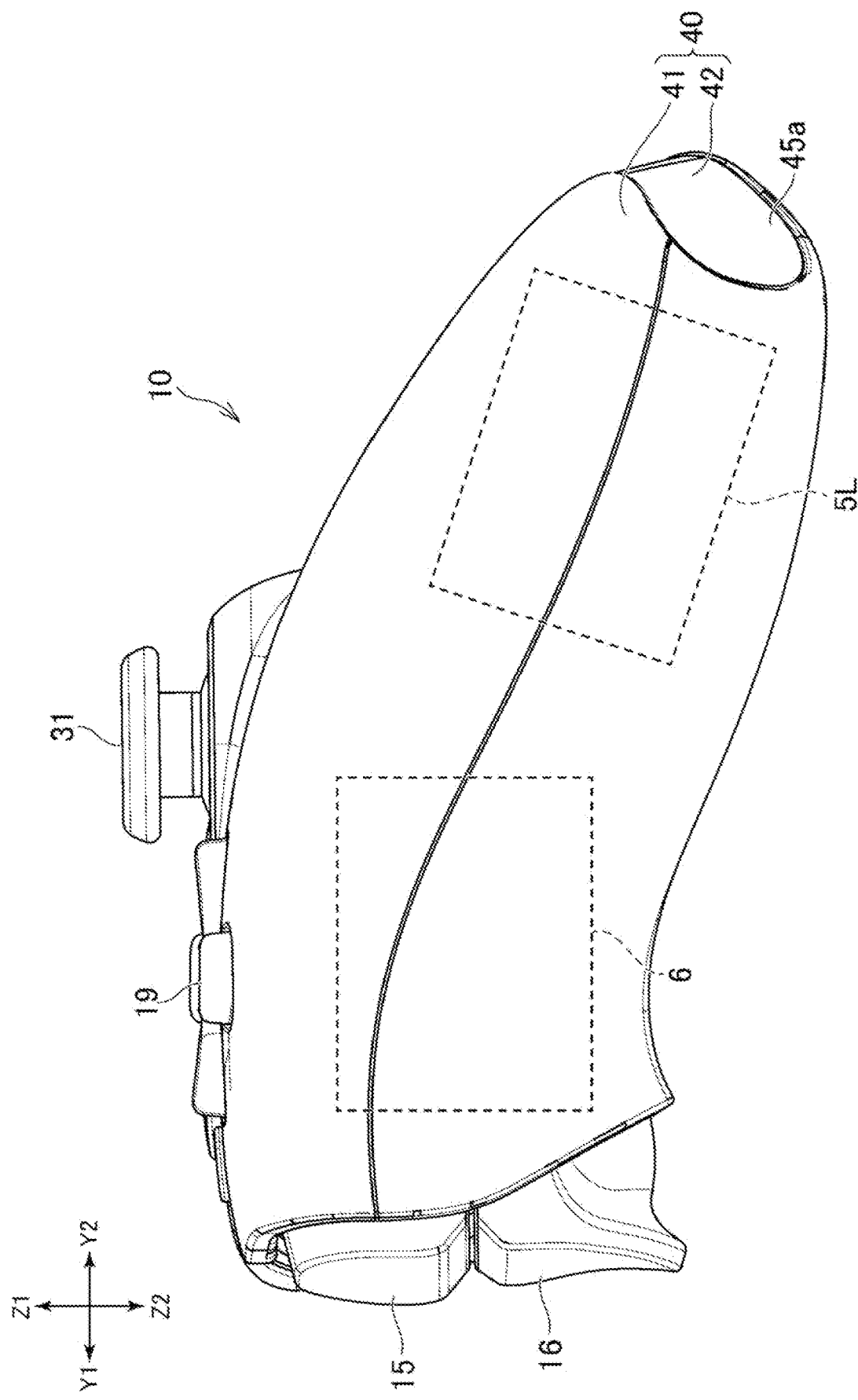

INPUT DEVICE AND COVER

CROSS REFERENCE TO RELATED APPLICATIONS

This application claims the benefit of Japanese Priority Patent Application JP 2020-065102 filed Mar. 31, 2020, the entire contents of which are incorporated herein by reference.

BACKGROUND

The present disclosure relates to an input device that is used for game control or the like, and a cover capable to be attached on an exterior surface of a cabinet of the input device.

As an example of input devices that are used for video games, a device disclosed in WO 2014/061322 is given. The input device disclosed in WO 2014/061322 includes, in its right or left portion, input members including an input stick (joystick), input buttons, a directional pad, or the like. The input device includes, as its exterior, an upper cabinet and a lower cabinet that are combined in an upward-downward direction. The upper cabinet and the lower cabinet are fixed to each other with screws. A circuit board is disposed in a space between the upper and lower cabinets.

SUMMARY

When the screws fixing the upper and lower cabinets are prevented from being exposed, an appearance of the input device can be enhanced.

According to an embodiment of the present disclosure, there is provided an input device including: a cabinet including an upper cabinet section and a lower cabinet section that are combined in an upward-downward direction; at least one fixture fixing the upper cabinet section to the lower cabinet section; and a cover attached to an exterior surface of the cabinet to cover the at least one fixture. The exterior surface of the cabinet has an exposed region adjacent to the cover and not covered by the cover. A step is formed between the exposed region of the exterior surface of the cabinet and an exterior surface of the cover, so that the exterior surface of the cover is recessed with respect to the exposed region of the exterior surface of the cabinet. With this input device, the fixture is covered by the cover, so that the appearance of the input device can be enhanced. Further, since the exterior surface of the cover is recessed with respect to the exterior surface of the cabinet, an observer looking at the input device hardly recognizes the cover as a cover. Thus, the appearance can be further enhanced.

According to another embodiment of the present disclosure, there is provided an input device including: a left held section on which an input member that is operated with a finger is disposed and which serves as a left portion of the input device; a right held section on which an input member that is operated with a finger is disposed and which serves as a right portion of the input device; a cabinet including an upper cabinet section and a lower cabinet section that are combined in an upward-downward direction, and a section forming the left held section and the right held section; at least one fixture fixing the upper cabinet section to the lower cabinet section; and a cover attached to an exterior surface of the cabinet to cover the at least one fixture. The at least one fixture is provided to each of the left held section and the right held section. The cover has a cover side portion covering the fixture in the left held section, a cover side portion covering the fixture in the right held section, and a cover center portion connecting the left and right cover side portions. With this input device, the fixture is covered by the cover, so that the appearance of the input device can be enhanced. Further, with this input device, the number of parts can be reduced.

According to an embodiment of the present disclosure, there is provided a cover capable to be attached on an exterior surface of a cabinet of an input device. The cabinet has a left held section which serves as a left portion of an input device and on which an input member is disposed, the input member being for operation with a finger; a right held section which serves as a right portion of the input device and on which an input member is disposed, the input member being for operation with a finger; and an upper cabinet section and a lower cabinet section that are combined in an upward-downward direction, each of the left and right held sections having at least one fixture that fixes the upper and lower cabinet sections to each other. The cover comprises a left cover side portion for covering the fixture in the left held section, a right cover side portion covering for the fixture in the right held section, and a cover center portion connecting the left and right cover side portions.

Note that "the upper cabinet section is fixed to the lower cabinet section" in the above-mentioned input device includes not only a mode in which these components are directly fixed to each other, but also a mode in which these components are indirectly fixed to each other through a frame accommodated in the cabinet, for example.

BRIEF DESCRIPTION OF THE DRAWINGS

FIG. 1B is a side view of the input device illustrated in FIG. 1A;

DETAILED DESCRIPTION OF THE PREFERRED EMBODIMENT

Now, an embodiment of the present disclosure is described with reference to the drawings. FIG. 1A to FIG. 1E and the like illustrate an input device 10 as an example of the embodiment. In the following description, in FIG. 1A to FIG. 1D, X1 and X2 respectively indicate a right direction and a left direction, Y1 and Y2 respectively indicate a forward direction and a rearward direction, and Z1 and Z2 respectively indicate an upward direction and a downward direction. Note that, these directions are defined for descriptions of shapes and relative positional relations of elements (parts, members, and portions) of the input device 10, and are not intended to limit a posture of the input device 10.

The input device 10 is used as an input device for an information processing apparatus 90 (see FIG. 22A; for example, video game console) having a game program execution function, a moving image reproduction function, a communication function via the Internet, and the like. The input device 10 can communicate with the information processing apparatus 90 in a wired or wireless manner, and transmits a signal based on an operation made by a user on the input device 10 to the information processing apparatus 90. The input device 10 incorporates various sensors (acceleration sensor, gyro sensor, and the like) that are used for detecting a posture or a motion of the input device 10, a battery, and the like.

Figure 1A:
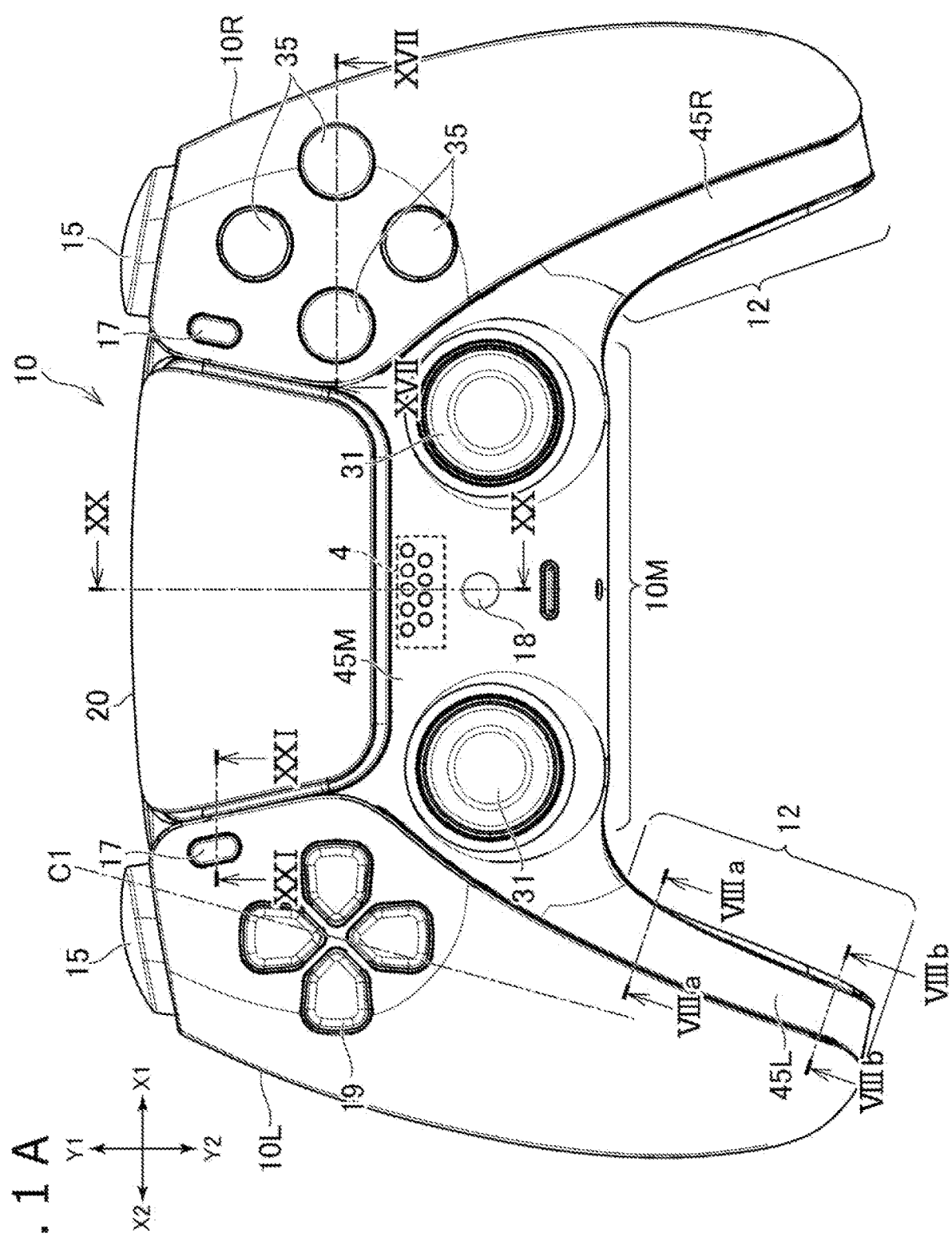
FIG. 1A is a plan view illustrating an example of an input device according to an embodiment of the present disclosure.
Figure 1C:
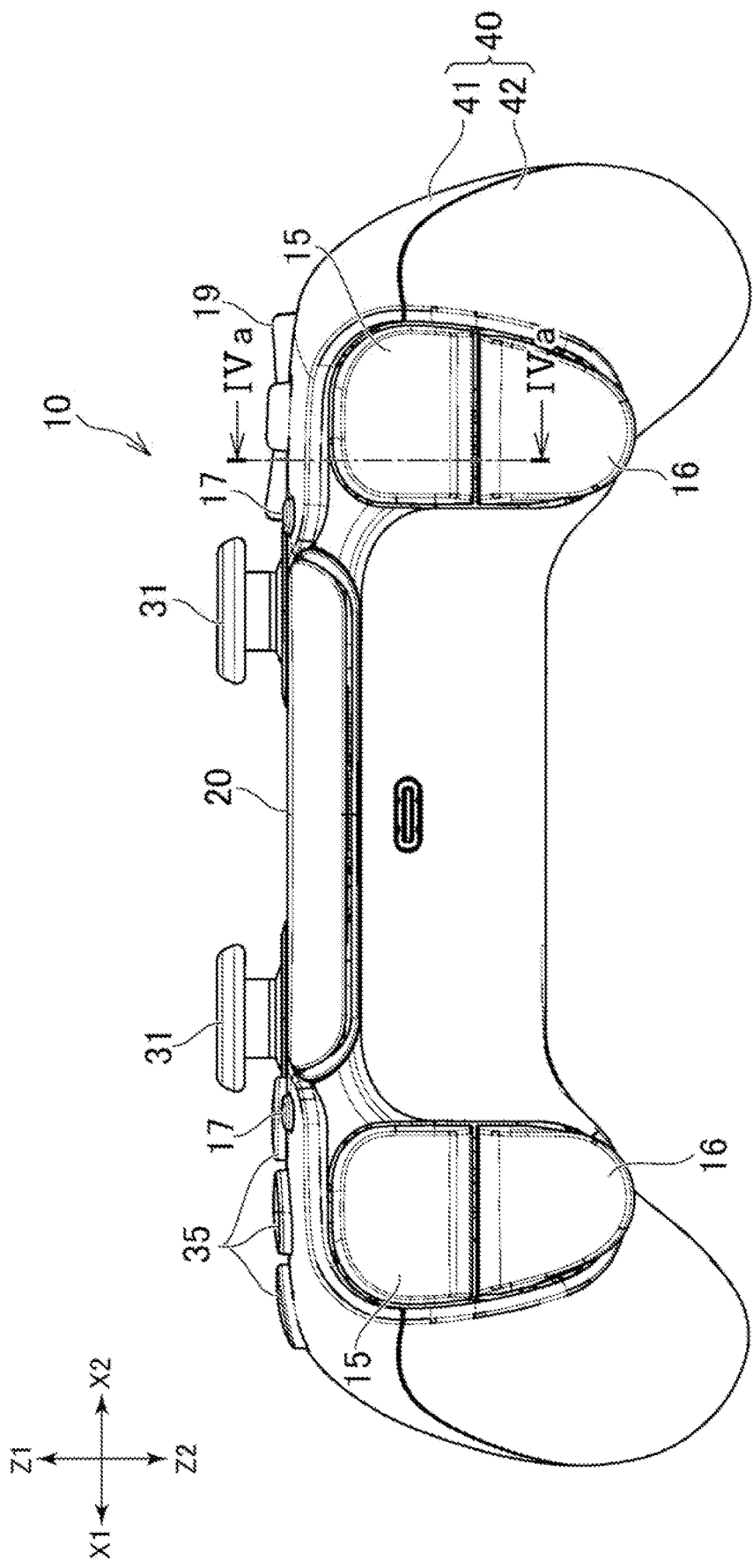
FIG. 1C is a front view of the input device.

Further, the input device 10 includes a first microphone 8A and a second microphone 8B (see FIG. 9) for acquiring spoken voice of the user, and a speaker 4 (see FIG. 1A). Voice data acquired through the microphones 8A and 8B is transmitted to the information processing apparatus 90 to be used in voice recognition processing or voice chat (voice communication) with other users. The other users' voice data is output from a speaker connected to the information processing apparatus 90 or the built-in speaker 4 of the input device 10.

[Input Member]

As illustrated in FIG. 1A, the input device 10 includes, in its left portion and right portion, a left held section 10L and a right held section 10R, respectively, that the user holds with his/her hands. The held sections 10L and 10R are separated from each other in a left-right direction, and a device center section 10M is formed between front portions of the held sections 10L and 10R.

The held sections 10L and 10R may each include a grip 12 extending rearward beyond a rear edge of the device center section 10M. A size of the device center section 10M in a forward-rearward direction may be the same as those of the held sections 10L and 10R. In this case, the held sections 10L and 10R may not include the grips 12 extending rearward.

As illustrated in FIG. 1A, a plurality of input members that the user operates with his/her fingers are provided on upper surfaces of front portions of the held sections 10L and 10R. Specifically, a plurality of input buttons 35 are provided on the upper surface of the front portion of the right held section 10R. For example, the four input buttons 35 are disposed at end portions of a cross. Further, a cross-shaped directional pad (cross button) 19 is disposed on the upper surface of the front portion of the left held section 10L. As illustrated in FIG. 1A, the input device 10 may include input buttons 17 on left and right sides of a front portion of an input member 20. Moreover, the held sections 10L and 10R may each include input buttons 15 and 16 (see FIG. 1C) on their front surfaces. The input buttons 15 and 16 are arranged in an upward-downward direction. The input button 16 on the lower side is a trigger button supported to be movable in the forward-rearward direction about an axis, for example. On a rear side of the input button 16, an actuator 6 (see FIG. 1B) configured to induce a reaction force to a motion of the input button 16 may be disposed.

As illustrated in FIG. 1A, the input device 10 may include input sticks 31. The input sticks 31 are disposed on left and right sides of a rear portion of the device center section 10M, for example. The input sticks 31 can each tilt in its radial direction or tilt and pivot around a center line of an initial position. The input sticks 31 may each be supported to be movable in the upward-downward direction, thereby functioning as a button. The input sticks 31 may each be slidable in the radial direction instead of being tiltable in the radial direction. Moreover, the input device 10 may include a button 18 positioned at a center in the left-right direction on a rear side of the input member 20. The button 18 functions as a power button of the information processing apparatus 90 to which the input device 10 is connected, or a start button for instructing start of wireless connection between the information processing apparatus 90 and the input device 10.

Note that, positions of the input sticks 31 and arrangement of the directional pad 19 and the input buttons 35 are not limited to the example in the input device 10. For example, the position of the input buttons 35 and the position of the input stick 31 may be interchanged. Further, the position of the directional pad 19 and the position of the input stick 31 may be interchanged.

As illustrated in FIG. 1A, the input device 10 includes the plate-like input member 20 on an upper surface of the device center section 10M. The input member 20 is disposed in front of the left and right input sticks 31, for example. The input member 20 includes a touch sensor. The touch sensor outputs a signal based on a position on an upper surface of the input member 20 where a finger touches. The touch sensor is a capacitive sensor, for example. The input member 20 may be supported to be movable in the upward-downward direction on the basis of a press operation by the user. The input device 10 includes a switch 23 (FIG. 20) configured to detect that the input member 20 has been pressed, and the input member 20 functions as a button supporting ON/OFF operations.

As illustrated in FIG. 1A, in the example of the input device 10, a width of the input member 20 in the left-right direction gradually increases toward the front. Thus, the user easily touches the front portion of the input member 20 with his/her thumbs while holding the held sections 10L and 10R with the hands.

[Exterior Member]

Figure 2:
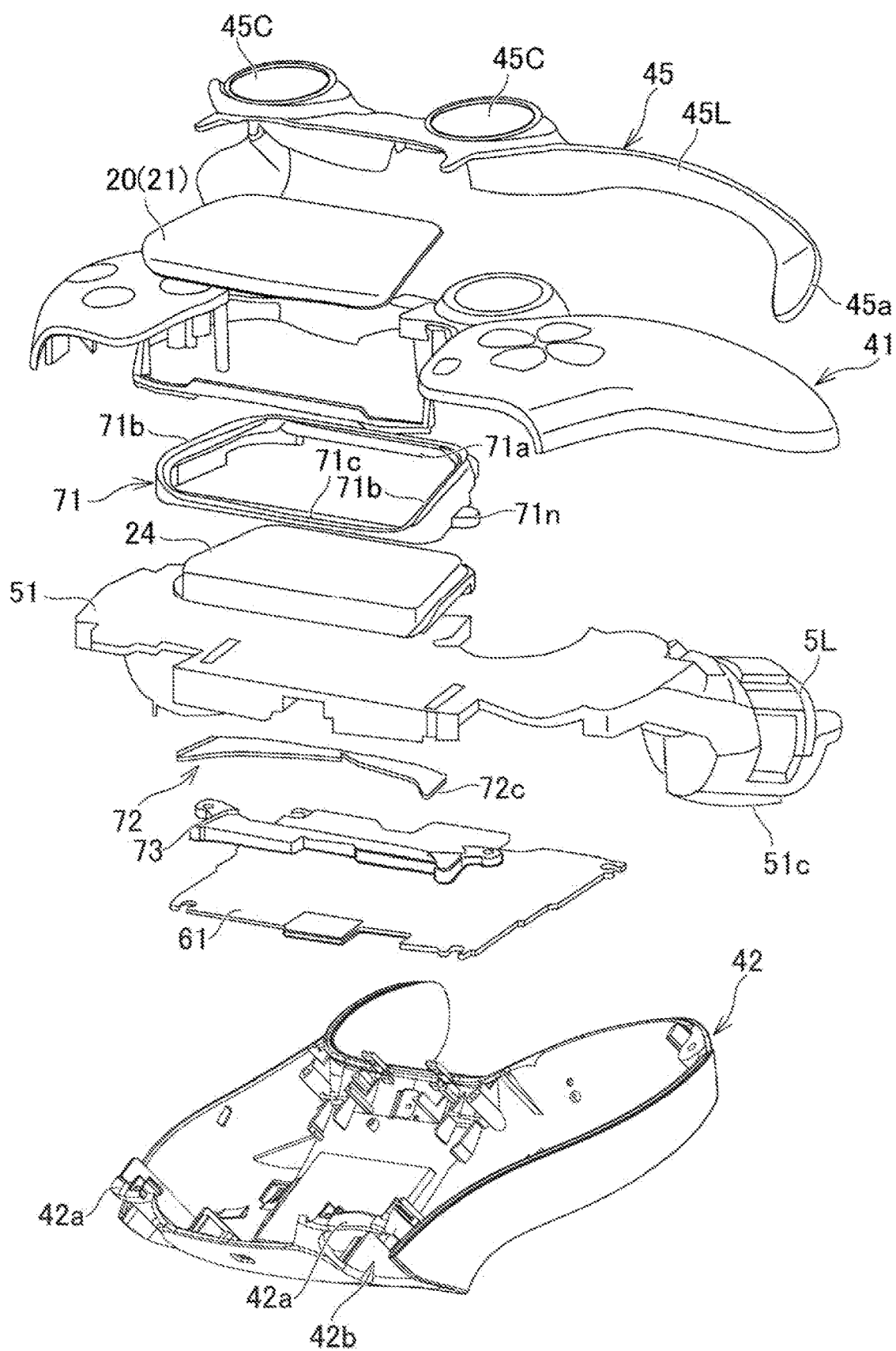
FIG. 2 is an exploded perspective view of the input device.

As illustrated in FIG. 2, the input device 10 includes a cabinet 40 serving as an exterior member of the input device 10. The cabinet 40 forms an exterior surface of the input device 10 and accommodates various parts of the input device 10 (a circuit board 61, vibration motors 5L and 5R, and the like). The cabinet 40 includes an upper cabinet section 41 and a lower cabinet section 42 that are combined in the upward-downward direction.

As illustrated in FIG. 2, the input device 10 includes a frame 51. Various parts of the input device 10 are fixed to the frame 51. For example, the vibration motor 5R is held on a right portion of the frame 51 and the vibration motor 5L is held on a left portion thereof. The vibration motors 5L and 5R vibrate the grips 12 on the basis of a situation in a video game executed by the information processing apparatus 90. The actuator 6 configured to move the trigger button 16 is disposed in front of each of the vibration motors 5L and 5R. The circuit board 61 is fixed to a lower side of a center portion of the frame 51. The upper cabinet section 41 covers an upper side of the frame 51 to form upper portions of the held sections 10L and 10R and the device center section 10M. The lower cabinet section 42 covers a lower side of the frame 51 to form lower portions of the held sections 10L and 10R and the device center section 10M.

The upper cabinet section 41 is attached to the frame 51 with fixtures such as screws or bolts. For example, the upper cabinet section 41 is directly fixed to the frame 51 with screws inserted from the lower side of the frame 51. The lower side of the frame 51 is covered by the lower cabinet section 42. Thus, the fixtures (screws) fixing the upper cabinet section 41 to the frame 51 are not exposed on the exterior surface of the input device 10.

Figure 4A:
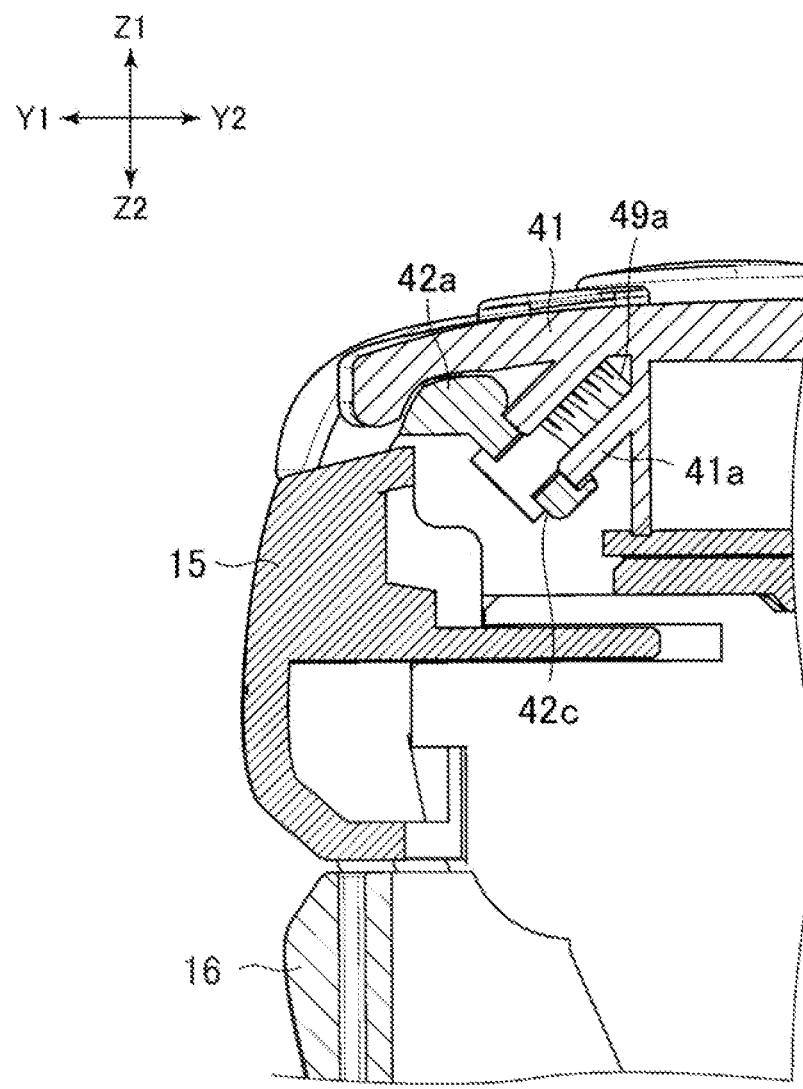
FIG. 4A is a sectional view taken along line IVa-IVa of FIG. 1C.

The lower cabinet section 42 (see FIG. 2) is fixed to the upper cabinet section 41, for example. Attachment positions thereof are provided on front and rear edges of the lower cabinet section 42, for example. In more detail, the lower cabinet section 42 has, in its front edge (front edges of the left and right held sections 10L and 10R), openings 42b (see FIG. 2) each for surrounding the input buttons 15 and 16, which are arranged in the upward-downward direction. A portion 42a that is an upper edge of the opening 42b and extends along an upper side of the input button 15 has a fixed portion 42c (see FIG. 4A). The fixed portion 42c is attached, with a screw 49a, to a fixed portion 41a (see FIG. 4A) formed at a front edge of the upper cabinet section 41, for example.

The fixed portions 42c and 41a are formed such that the screw 49a is inserted in an oblique direction with respect to the upward-downward direction. With this, the screw 49a is prevented from interfering with the trigger button 16 when being inserted. The input button 15 covers front sides of the fixed portions 42c and 41a and the screw 49a to prevent these components from being exposed. The input button 15 may be attached to the cabinet 40 with engagement portions (for example, claw portions) formed on the input button 15.

Figure 3:
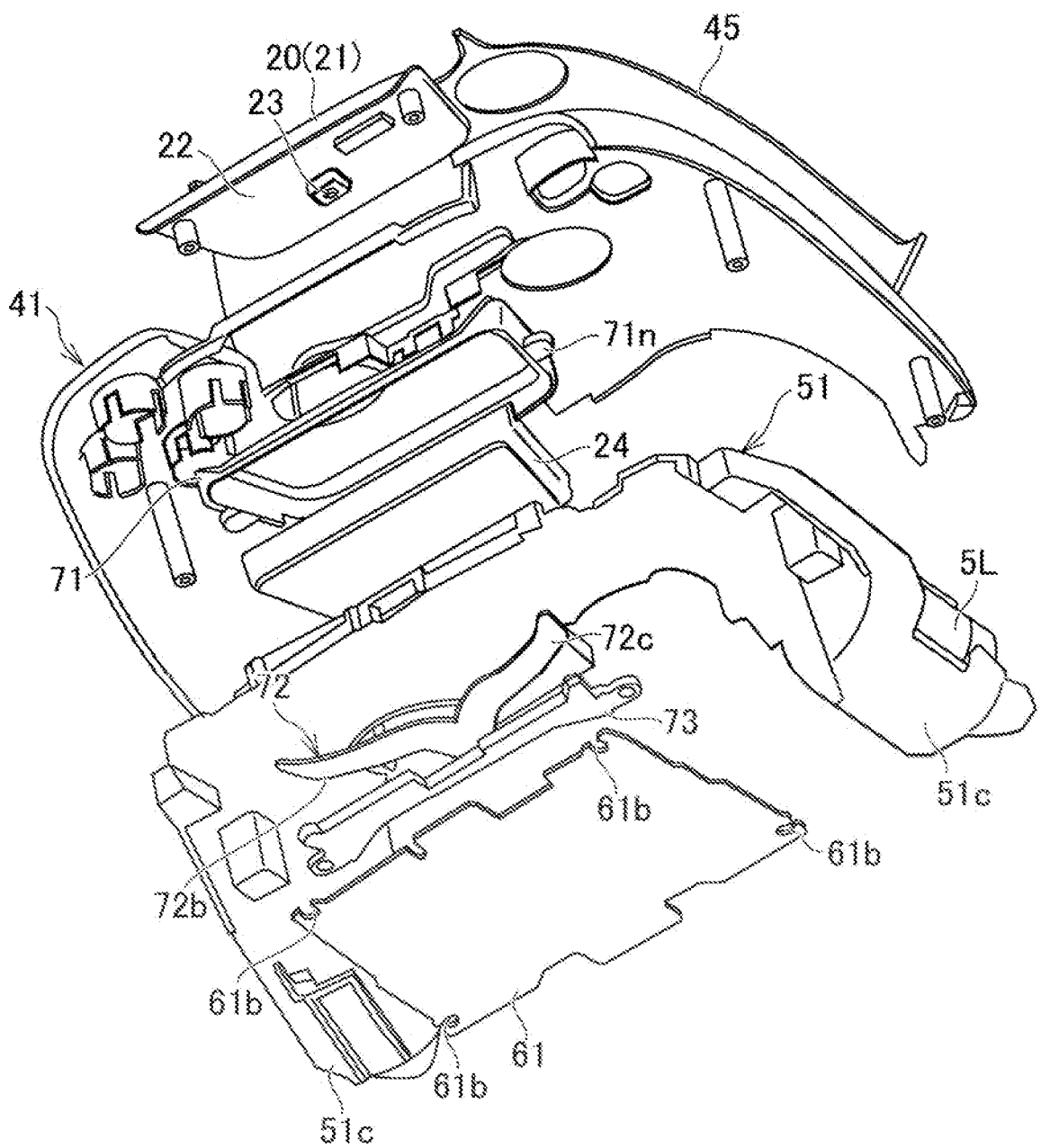
FIG. 3 is an exploded perspective view of the input device.
Figure 4B:
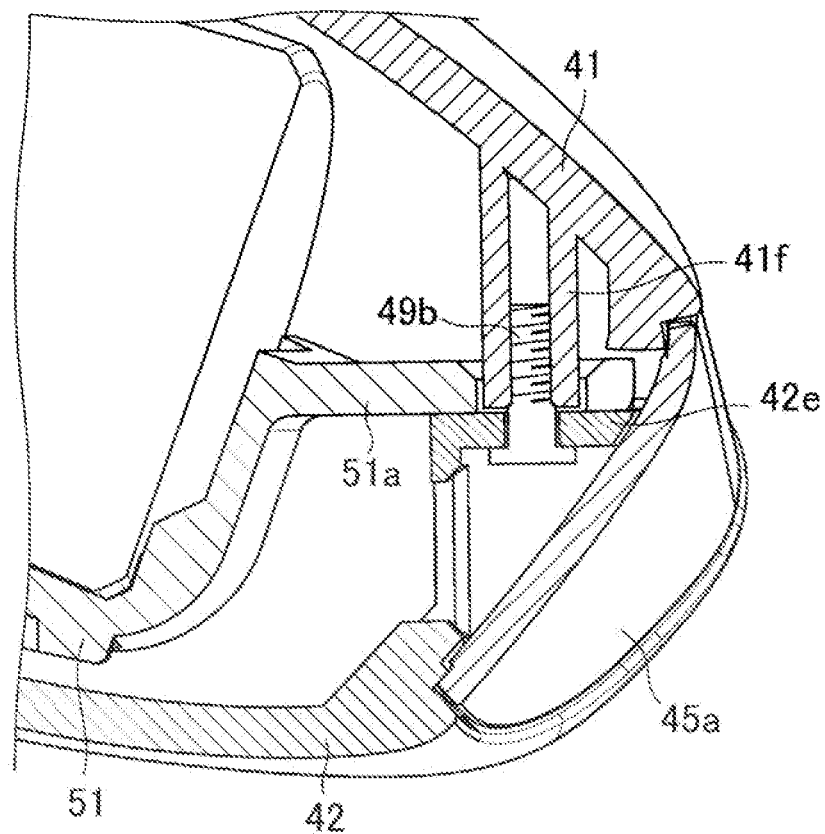
FIG. 4B is a sectional view taken along line IVb-IVb of FIG. 1D.

Further, as illustrated in FIG. 3 and FIG. 4B, the lower cabinet section 42 has fixed portions 42e in its rear edge (rear edges of the left and right held sections 10L and 10R). The fixed portions 42e are each fixed, with a screw 49b, to a fixed portion 41f formed at a rear edge of the upper cabinet section 41. The frame 51 has, in its rear edge, fixed portions 51a protruding rearward. The fixed portions 51a are each fixed to the fixed portion 41f of the upper cabinet section 41 together with the fixed portion 42e of the lower cabinet section 42.

An attachment structure of the cabinet sections 41 and 42 is not limited to the example in the input device 10. For example, the frame 51 may be fixed to the lower cabinet section 42 with screws, and the upper cabinet section 41 may be fixed to the lower cabinet section 42 with screws. In another example, the cabinet sections 41 and 42 may each be attached to the frame 51 such that the two cabinet sections 41 and 42 are indirectly fixed to each other through the frame 51. In still another example, the input device 10 may not include the frame 51. In this case, the upper cabinet section 41 and the lower cabinet section 42 may be directly fixed to each other.

As illustrated in FIG. 1A and FIG. 2, the input device 10 includes, as one of its exterior members, a cover 45 attached to an exterior surface of the cabinet 40. The cover 45 has a right cover side portion 45R serving as a part of an exterior surface of the right held section 10R, a left cover side portion 45L serving as a part of an exterior surface of the left held section 10L, and a cover center portion 45M that connects the left and right cover side portions 45L and 45R and serves as a part of an exterior surface of the device center section 10M.

Figure 1D:
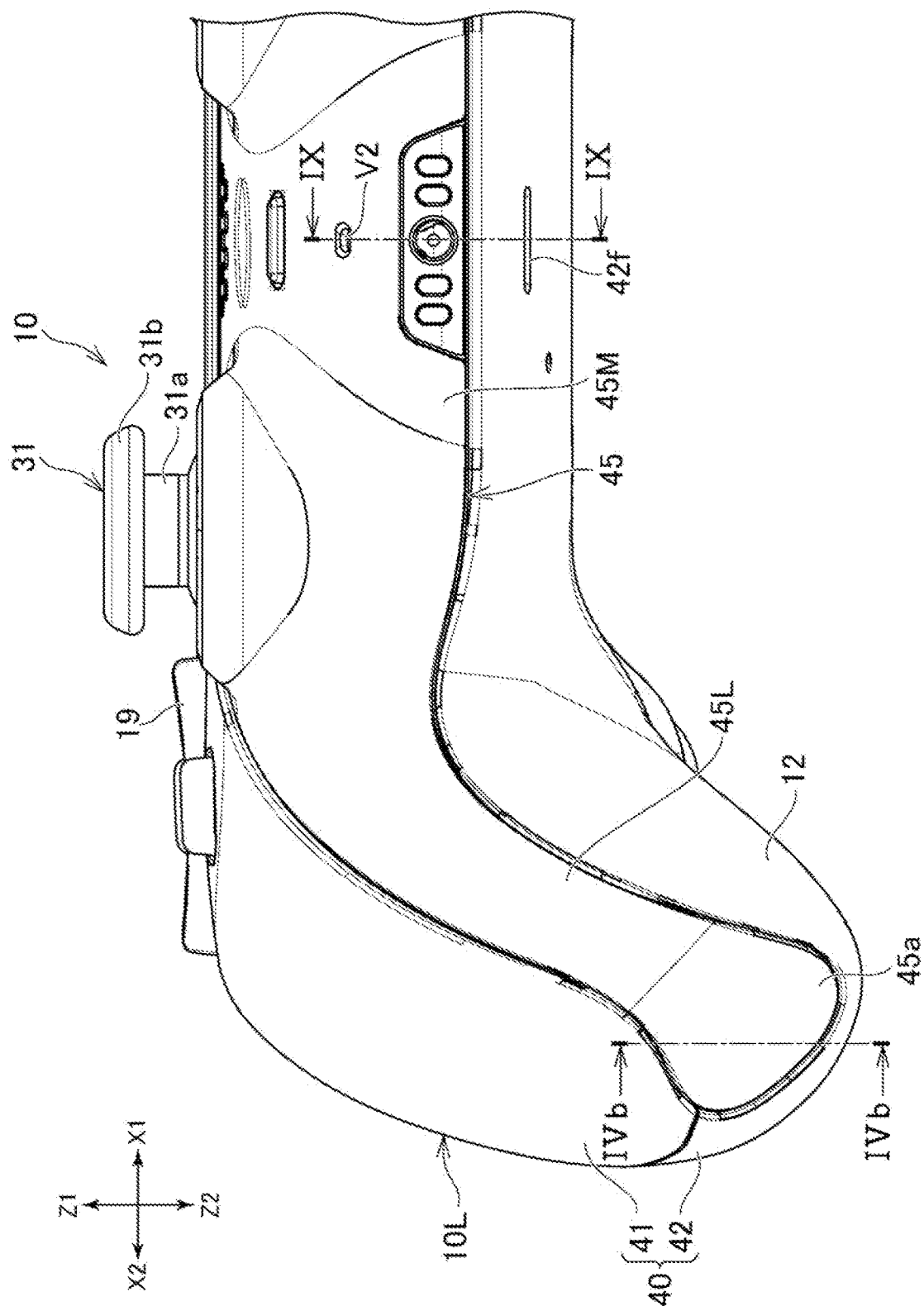
FIG. 1D is a rear view of the input device.

As illustrated in FIG. 4B, the cover 45 includes a fixture cover 45a covering the fixture fixing the lower cabinet section 42 (specifically, the screw 49b) and the fixed portions 42e and 41f. The fixture cover 45a is positioned on a rear side of the screw 49b and the fixed portions 42e, 41f, and 51a to cover these components. The fixture cover 45a is provided to each of the left and right cover side portions 45L and 45R. As illustrated in FIG. 1D and FIG. 4B, the fixture cover 45a is positioned on the rear side of the left or right held section 10L or 10R and attached to the rear edge of the held section 10L or 10R (that is, the rear edge of the left or right grip 12).

The screws 49b are not exposed on the exterior surface of the input device 10 in this way, so that an appearance of the input device 10 can be enhanced. Further, since the left and right screws 49b are covered by the single cover 45, the number of parts can be reduced, and assembly of the input device 10 can thus be simplified.

The screw 49b is inserted into the fixed portion 42e of the lower cabinet section 42 and the fixed portion 41f of the upper cabinet section 41 in the upward-downward direction. A part (lower part) of the fixture cover 45a is positioned below the fixed portions 42e and 41f. That is, the part (lower part) of the fixture cover 45a is positioned in a pull-out direction of the screw 49b from the fixed portions 42e and 41f. Another part (upper part) of the fixture cover 45a is positioned on a rear side of the fixed portions 42e and 41f.

As illustrated in FIG. 1A, the cover side portions 45L and 45R are attached to inner side surfaces of the left and right grips 12. The right fixture cover 45a is bent at a rear edge of the right cover side portion 45R to be positioned on the rear side of the right grip 12. The left fixture cover 45a is bent at a rear edge of the left cover side portion 45L to be positioned on the rear side of the left grip 12.

The cover center portion 45M is positioned in the rear portion of the device center section 10M. The cover center portion 45M is positioned on the rear side of the input member 20. The cover center portion 45M has openings 45c in which the left and right input sticks 31 are disposed.

Note that, in the example of the input device 10, the grips 12 and the cover side portions 45L and 45R are symmetrical in the left-right direction. Unlike the example of the input device 10, these components may not be symmetrical in the left-right direction. In this case, the cover 45 may only have either one of the left and right cover side portions 45L and 45R.

Figure 6:
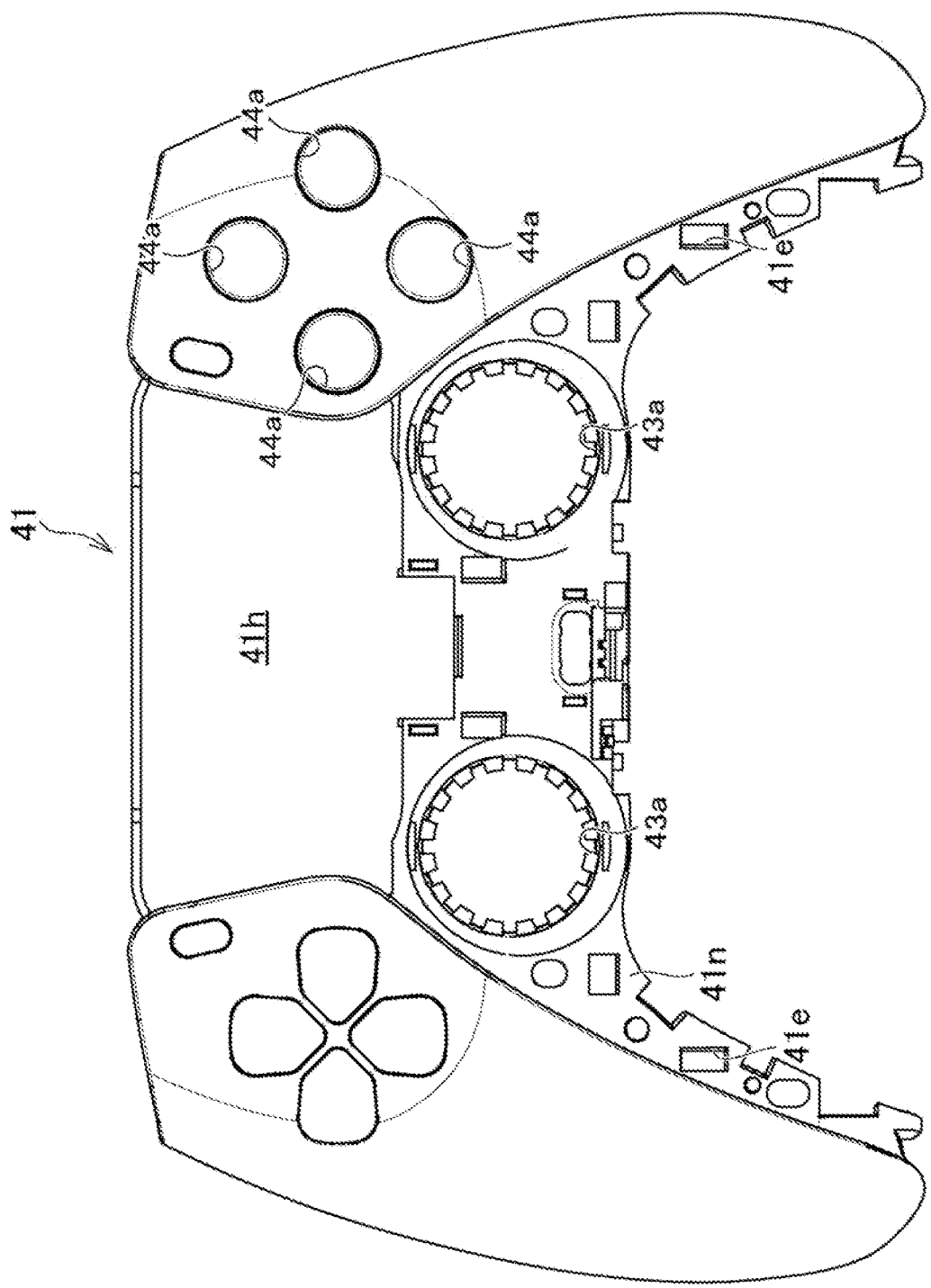
FIG. 6 is a plan view of an upper cabinet section.

As illustrated in FIG. 6, the upper cabinet section 41 has a covered region 41n that is covered by the cover 45. A plurality of engagement holes 41e are formed in the covered region 41n, and engagement portions (for example, claw portions) of the cover 45 are engaged with the engagement holes 41e.

Figure 7:
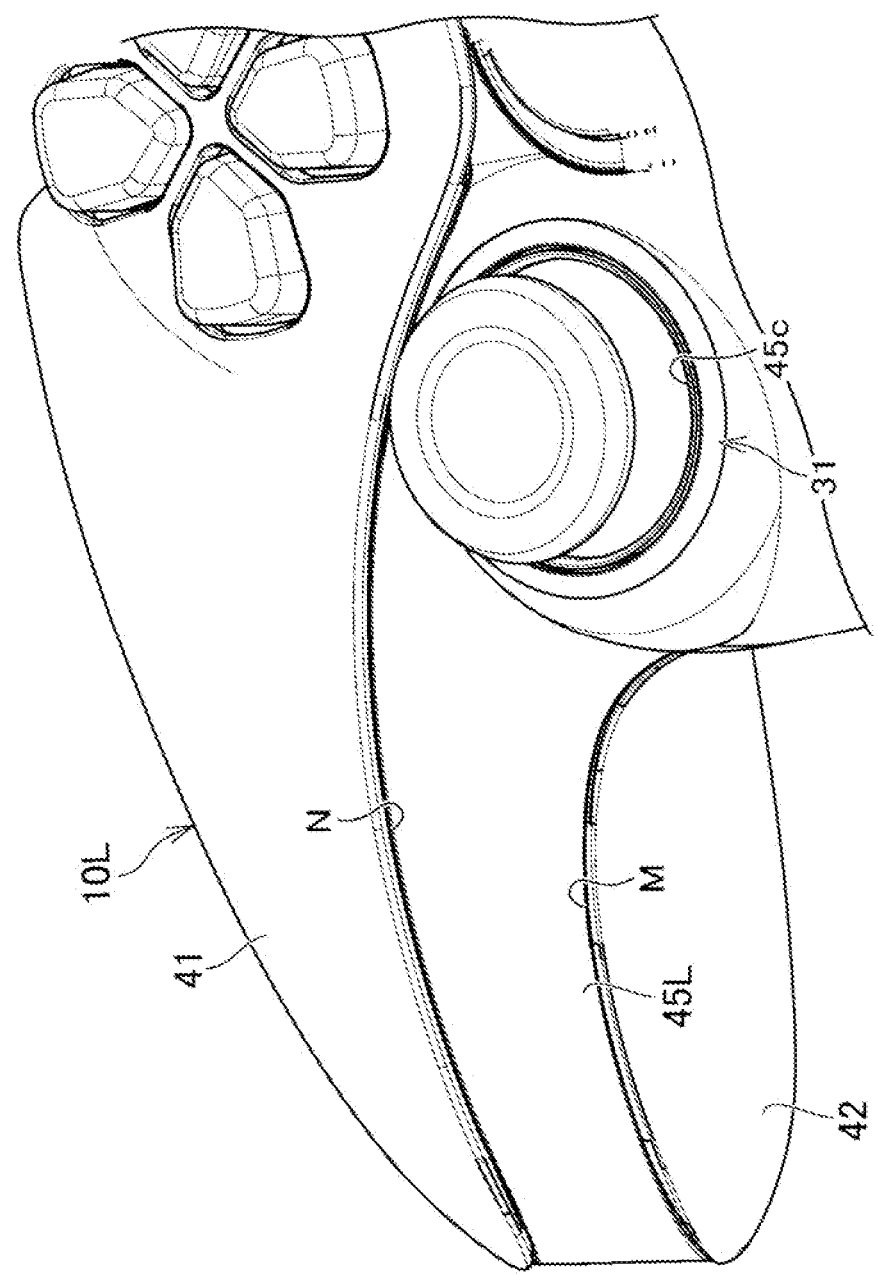
FIG. 7 is a perspective view illustrating a grip.
Figure 8A:
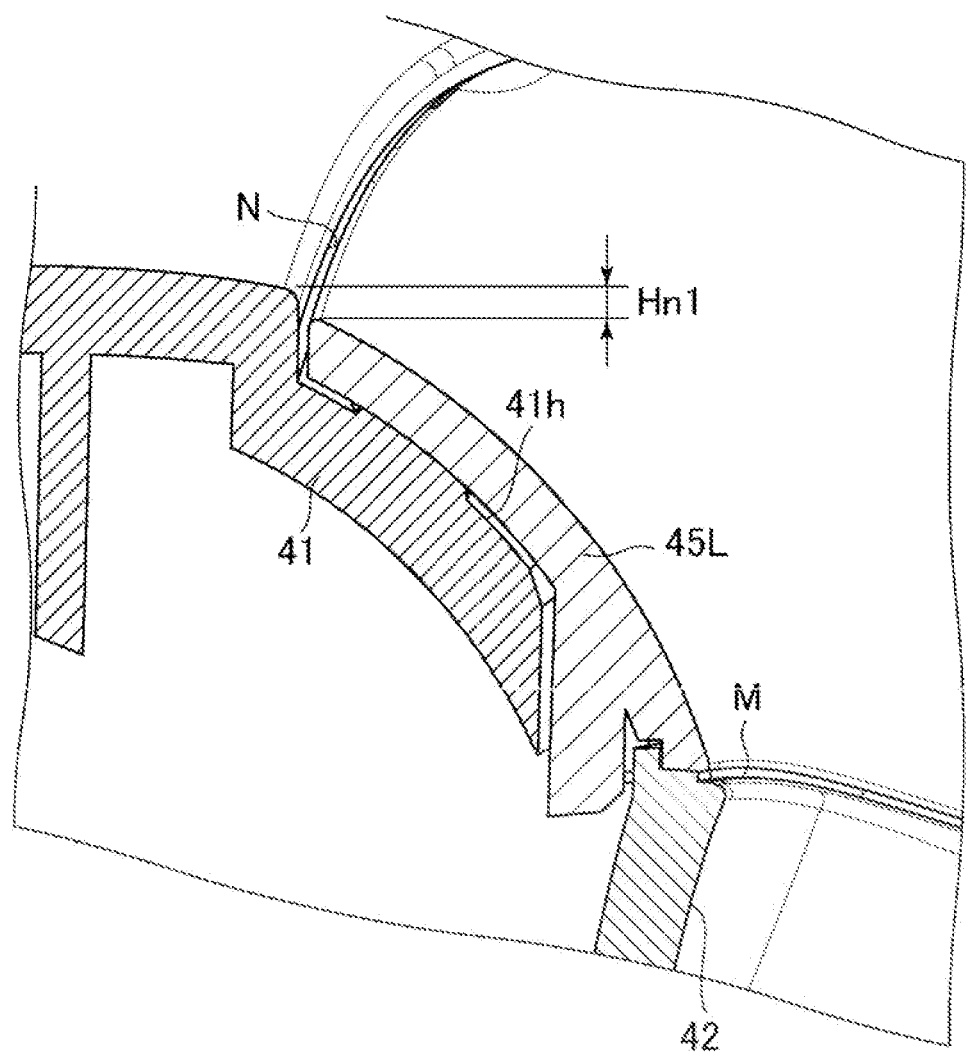
FIG. 8A is a sectional view taken along line VIIIa-VIIIa of FIG. 1A.

The exterior surface of the upper cabinet section 41 has, in addition to the covered region 41n, a region adjacent to the covered region 41n and not covered by the cover 45 (exposed region) (see FIG. 1A and FIG. 6). As illustrated in FIG. 7 and FIG. 8A, a step N is formed between the exposed region of the exterior surface of the upper cabinet section 41 and an exterior surface of the cover 45. With the step N, the exterior surface of the cover 45 is recessed from the exposed region of the exterior surface of the upper cabinet section 41.

In the example of the input device 10, the step N is formed between the exterior surfaces of the cover side portions 45L and 45R and the exterior surface of the upper cabinet section 41 serving as the grips 12. The step N may extend from the front portions of the held sections 10L and 10R to the rear edges thereof (the rear edges of the grips 12).

When a cover is attached to a cabinet, in general, an exterior surface of the cover is made flush with an exterior surface of the cabinet or the cover is positioned to be raised compared to the exterior surface of the cabinet. In contrast to this, in the example of the input device 10, the exterior surface of the cover 45 is positioned to be lowered (recessed) compared to the exterior surface of the cabinet 40, so that an observer looking at the input device 10 hardly recognizes the cover 45 as a cover. With this, the appearance of the input device 10 can be enhanced.

As illustrated in FIGS. 7 and 8A, a step M may be formed between the exterior surfaces of the cover side portions 45L and 45R and an exterior surface of the lower cabinet section 42 serving as the grips 12. This structure makes it more difficult for the observer looking at the input device 10 to recognize the cover 45, so that the appearance of the input device 10 can be further enhanced.

The left and right cover side portions 45L and 45R are attached to the inner side surfaces of the left and right grips 12. That is, the cover side portion 45L or 45R is attached to a substantial center region in the left-right direction of the exterior surface of the grip 12 (the exterior surface of the cabinet 40). Thus, positions of the balls of the thumbs of the user griping the grips 12 can be guided by the step N, for example. Further, a possibility that the palms of the user griping the grips 12 make contact with the step N can be reduced, which means that a comfortable grip can be achieved. In the example of the input device 10, a boundary (the step N) between the cover side portion 45R or 45L and the exposed region of the upper cabinet section 41 is positioned on an inner side of a center line C1 of the grip 12 (see FIG. 1A).

Figure 8B:
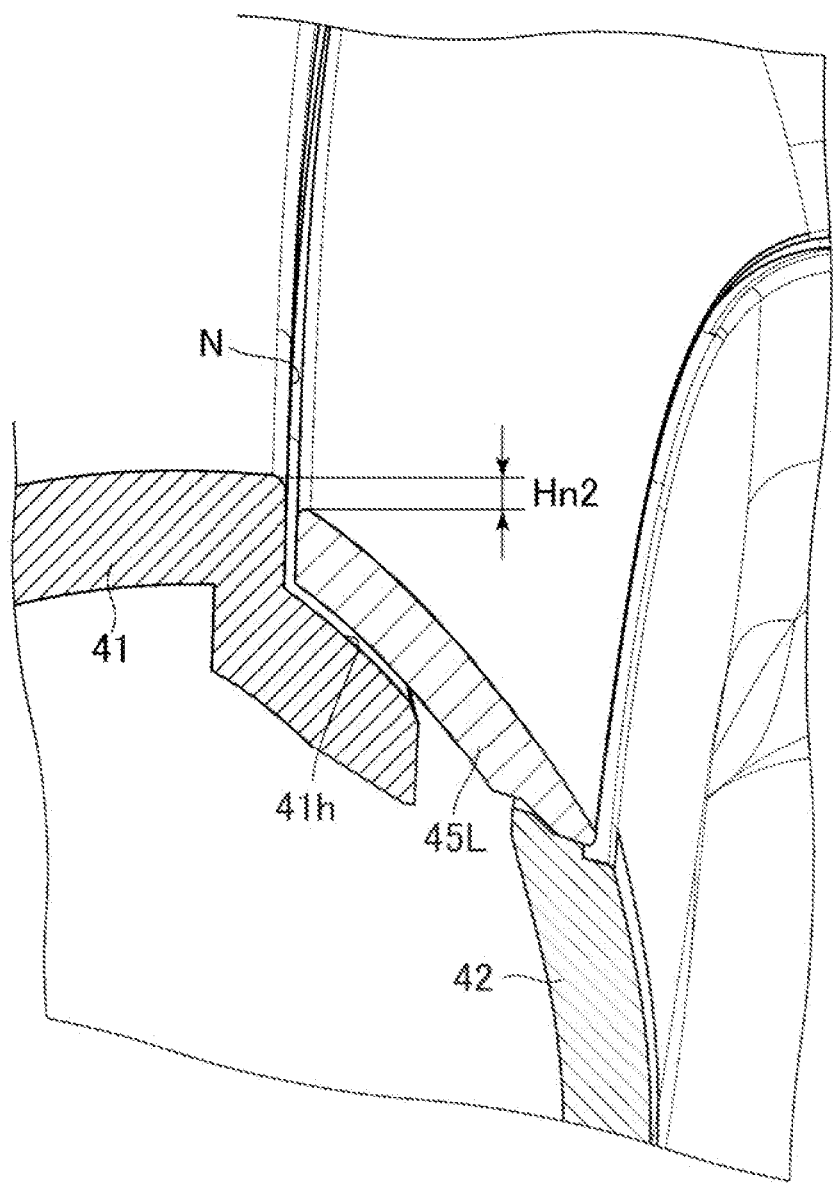
FIG. 8B is a sectional view taken along line VIIIb-VIIIb of FIG. 1A.

A height of the step N may not be constant in its extending direction. In the example of the input device 10, a height Hn2 of the step N in a rear portion of the grip 12 (see FIG. 8B) is smaller than a height Hn1 of the step N in a front portion of the grip 12 (see FIG. 8A). The user's palms tend to touch the rear portions of the grips 12. Thus, the structure in which the height Hn2 of the step N in the rear portions is smaller than the height Hn1 of the step N in the front portions makes it possible for the user to grip the grips 12 in a more comfortable manner.

[Arrangement of Microphones]

Figure 9:
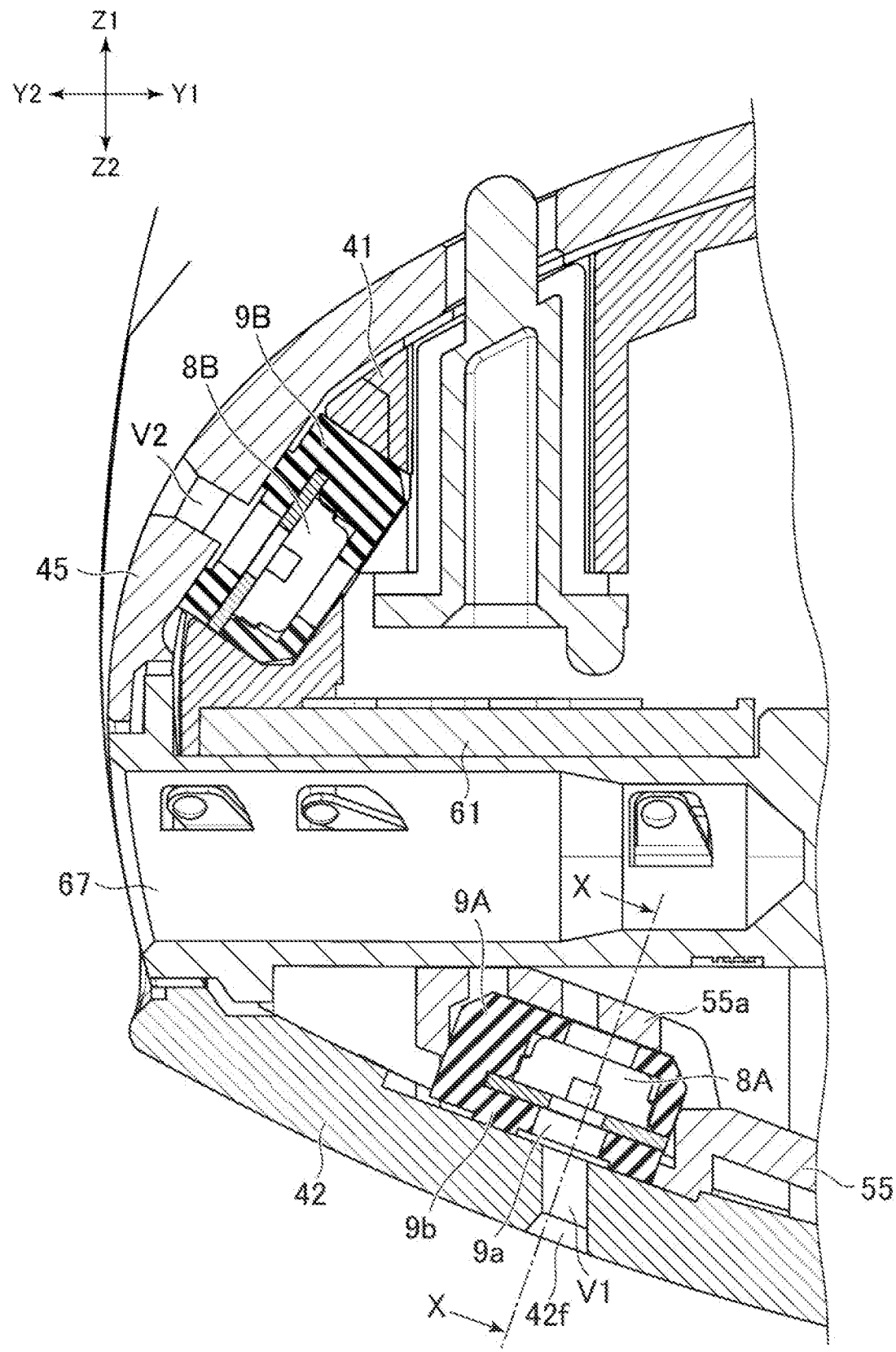
FIG. 9 is a sectional view taken along line IX-IX of FIG. 1D.

As illustrated in FIG. 9, the input device 10 may include the two microphones 8A and 8B. The two microphones 8A and 8B are disposed at positions with different distances to the mouth of the user holding the input device 10. The first microphone 8A is disposed below the circuit board 61, for example, and the second microphone 8B is disposed above the circuit board 61, for example. A connector 67 (for example, headset jack) mounted on the circuit board 61 is positioned between the first microphone 8A and the second microphone 8B.

To achieve voice recognition processing and voice chat, the input device 10 includes a voice input/output circuit configured to execute beam forming processing of forming directivity of sensitivities of the microphones 8A and 8B. The voice input/output circuit generates microphone voice data having directivity. That is, the voice input/output circuit generates, using a phase difference between microphone voice data obtained from the microphones 8A and 8B, data having emphasized data (signal) representing a spoken voice of the user.

As illustrated in FIG. 9, for example, the second microphone 8B is supported by the upper cabinet section 41 and disposed along an inner surface of the cover 45. The second microphone 8B is oriented obliquely rearward and upward, for example.

The cover 45 has a second sound hole V2 at a position corresponding to the second microphone 8B. The second microphone 8B is held by a microphone holder 9B made of an elastic material, for example. The microphone holder 9B has a hole at a position corresponding to the second microphone 8B. The second sound hole V2 of the cover 45 is connected to the second microphone 8B through the hole of the microphone holder 9B. The input device 10 may not include the cover 45. In this case, the second sound hole V2 may be formed in the upper cabinet section 41, and the second microphone 8B may be supported by the frame 51.

As illustrated in FIG. 9, the first microphone 8A is disposed along an inner surface of the lower cabinet section 42, for example. The first microphone 8A is supported by a microphone support portion 55a formed at a rear edge of a holder 55 for a battery 62 (see FIG. 20) disposed below the circuit board 61, for example. The first microphone 8A is held by a microphone holder 9A. The microphone holder 9A is in abutment against the inner surface of the lower cabinet section 42. The first microphone 8A is oriented obliquely rearward and downward, for example.

[Sound Hole]

As illustrated in FIG. 9, the lower cabinet section 42 has a first sound hole V1 penetrating the lower cabinet section 42. The microphone holder 9A has a sealing portion 9b positioned between the first microphone 8A and the inner surface of the lower cabinet section 42. The sealing portion 9b is in abutment against the inner surface of the lower cabinet section 42. The sealing portion 9*b* has a hole 9*a* at a position corresponding to the first microphone 8A. The first sound hole V1 of the lower cabinet section 42 is connected to the first microphone 8A through the hole 9*a* of the microphone holder 9A. An edge of the hole 9*a* formed in the sealing portion 9*b* is in abutment against the inner surface of the lower cabinet section 42, so that the first sound hole V1 is sealed from its entrance to the first microphone 8A.

Note that, "the first sound hole V1 is connected to the first microphone 8A" means that a passage that transfers sound from the hole of the lower cabinet section 42 to the first microphone 8A is formed. This passage is not necessarily sealed. Further, the first microphone 8A may be separated from the inner surface of the lower cabinet section 42. For example, the first microphone 8A may be mounted on the circuit board 61. In this case, a sound hole extending from an opening edge formed in the lower cabinet section 42 to the first microphone 8A may be formed.

Figure 1E:
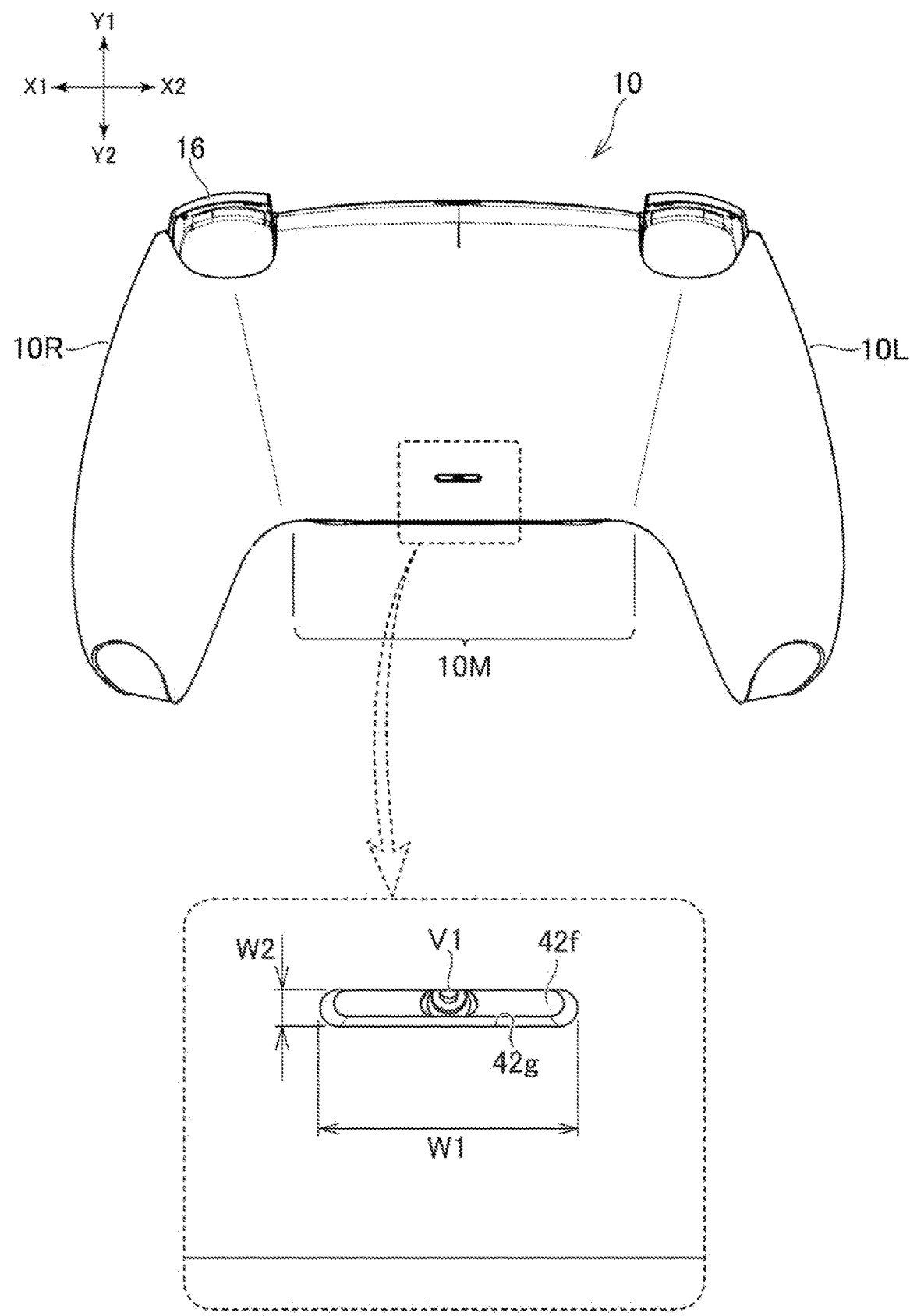
FIG. 1E includes a bottom view of the input device and an enlarged view of part of the bottom view.
Figure 10:
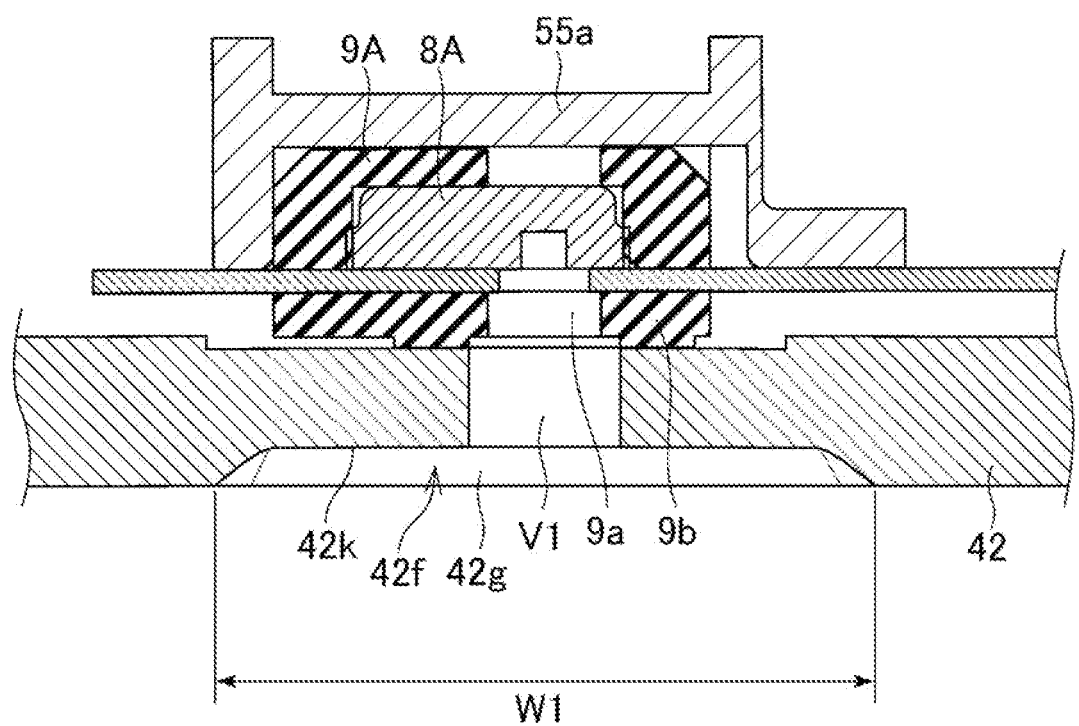
FIG. 10 is a sectional view taken along line X-X of FIG. 9.

As illustrated in FIG. 1E and FIG. 10, a recessed portion 42*f* is formed in the exterior surface of the lower cabinet section 42. The recessed portion 42*f* does not penetrate the lower cabinet section 42. The first sound hole V1 is formed in a bottom surface 42*k* of the recessed portion 42*f*. The lower cabinet section 42 has, inside the recessed portion 42*f*, the bottom surface 42*k* extending from the opening edge (entrance) of the first sound hole V1. An inner surface 42*g* of the recessed portion 42*f* functions as a wall surrounding the first sound hole V1. The recessed portion 42*f* is hereinafter referred to as "protection recessed portion."

If the user chatting with another user via voice chat moves a finger along the exterior surface of the input device 10 to cover the first sound hole V1 with the finger, an air pressure in the first sound hole V1 suddenly changes, with the result that voice that is transmitted to the other user over voice chat may possibly have noise. In the example of the input device 10, since the wall that is the inner surface 42*g* of the protection recessed portion 42*f* is formed around the first sound hole V1, the entrance of the first sound hole V1 is less likely to be entirely covered by the finger. As a result, the generation of noise described above can be suppressed.

As illustrated in FIG. 10, the protection recessed portion 42*f* is a groove, and a length of the inner region of the protection recessed portion 42*f* (a width W1 in one of two orthogonal directions; see FIG. 1) is larger than a width W2 of the same region in the other direction (the width W1 is hereinafter referred to as "large width" and the width W2 is hereinafter referred to as "small width"). In the example of the input device 10, the width W1 is a size in the left-right direction, and the width W2 is a size in the forward-rearward direction.

The small width W2 is smaller than a width of a finger contact region when the user touches the exterior surface of the input device 10 with a finger. Meanwhile, the large width W1 is larger than the width of the finger contact region. With the protection recessed portion 42*f* designed to have such a size, the protection recessed portion 42*f* can be prevented from being entirely covered by the finger of the user, with the result that a sudden change in air pressure in the first sound hole V1 can be effectively suppressed. The small width W2 is smaller than 3 mm, for example. The small width W2 may be smaller than 2 mm. The large width W1 is larger than 7 mm, for example. The large width W1 may be larger than 9 mm.

As illustrated in FIG. 10, the large width W1 is larger than twice a size of the first sound hole V1 (a size in the same direction as the large width W1). The large width W1 may be larger than three times the size of the first sound hole V1. Meanwhile, the small width W2 may be the same as the size of the first sound hole V1 or smaller than twice the size of the first sound hole V1. An entrance shape of the first sound hole V1 is round, for example.

As illustrated in FIG. 10, the large width W1 is larger than a size of the first microphone 8A (a size in the same direction as the large width W1). Meanwhile, the small width W2 is smaller than the size of the first microphone 8A. As illustrated in FIG. 9, the small width W2 may be the same as the size of the entrance of the first sound hole V1 (the hole formed in the lower cabinet section 42) or larger than the entrance of the first sound hole V1.

As illustrated in FIG. 1E, the first sound hole V1 is formed in a lower surface of the device center section 10M. In more detail, the first sound hole V1 is formed at a position near the rear edge of the device center section 10M. The first sound hole V1 is positioned at a center of the input device 10 in the left-right direction. The fingers of the user holding the input device 10 with his/her hands obliquely extend from the side surfaces of the input device 10 to the center of the input device 10 in the left-right direction. When the user moves a finger along a lower surface of the input device 10, the finger moves in an oblique direction with respect to both the forward-rearward direction and the left-right direction. Meanwhile, the protection recessed portion 42*f* (in other words, the region inside the protection recessed portion 42*O* is elongated in the left-right direction. With the protection recessed portion 42*f* having this shape, the protection recessed portion 42*f* can be effectively prevented from being entirely covered by the finger obliquely moving on the lower surface side of the input device 10.

Note that, the shape of the protection recessed portion 42*f* is not limited to the example in the input device 10. For example, the protection recessed portion 42*f* may be a groove elongated in the forward-rearward direction. In another example, the protection recessed portion 42*f* may have an oval shape. In still another example, the protection recessed portion 42*f* may have a cross shape, an H shape, or a T shape. In this case, the first sound hole V1 is preferably formed in a small-width groove portion of the protection recessed portion 42*f*. With this, the first sound hole V1 can be suppressed from being entirely covered by the fingers of the user.

As described above, the upper cabinet section 41 has the second sound hole V2 connected to the second microphone 8B. The large width W1 of an opening portion of the first sound hole V1 in the left-right direction is larger than the width of the second sound hole V2 in the left-right direction. Meanwhile, the small width W2 of the opening portion of the first sound hole V1 in a direction orthogonal to the left-right direction may be the same as the width of the second sound hole V2 in the direction orthogonal to the left-right direction.

Figure 11A:
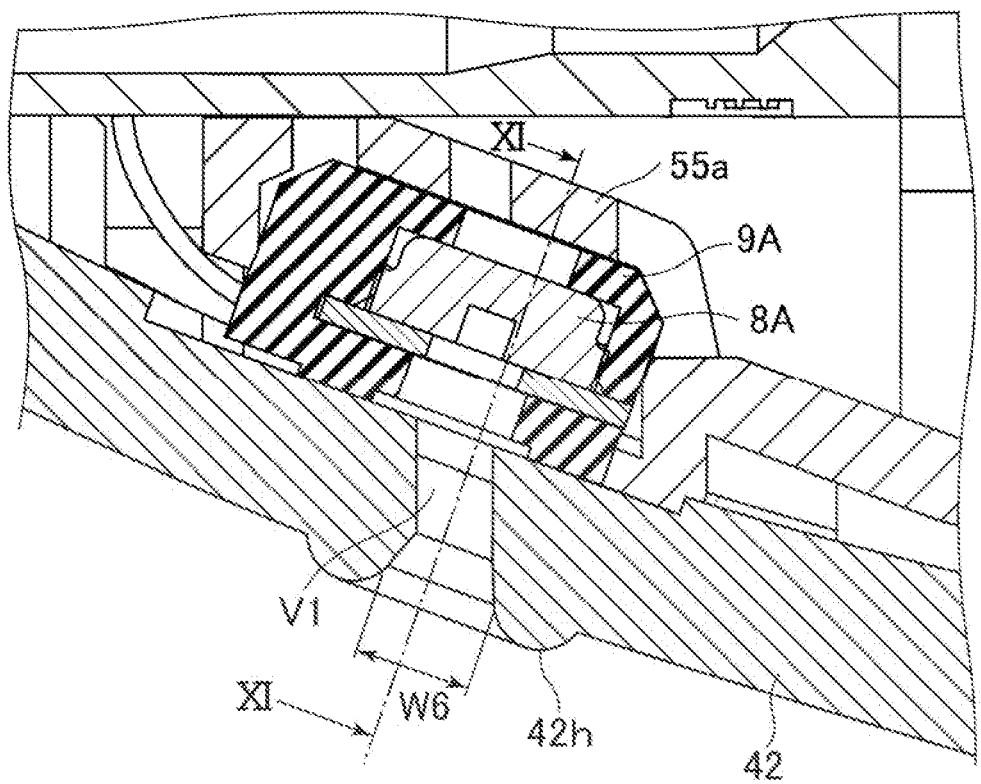
FIG. 11A is a sectional view illustrating a modified example of a sound hole, which is obtained from a cross section like the one in FIG. 9.
Figure 11B:
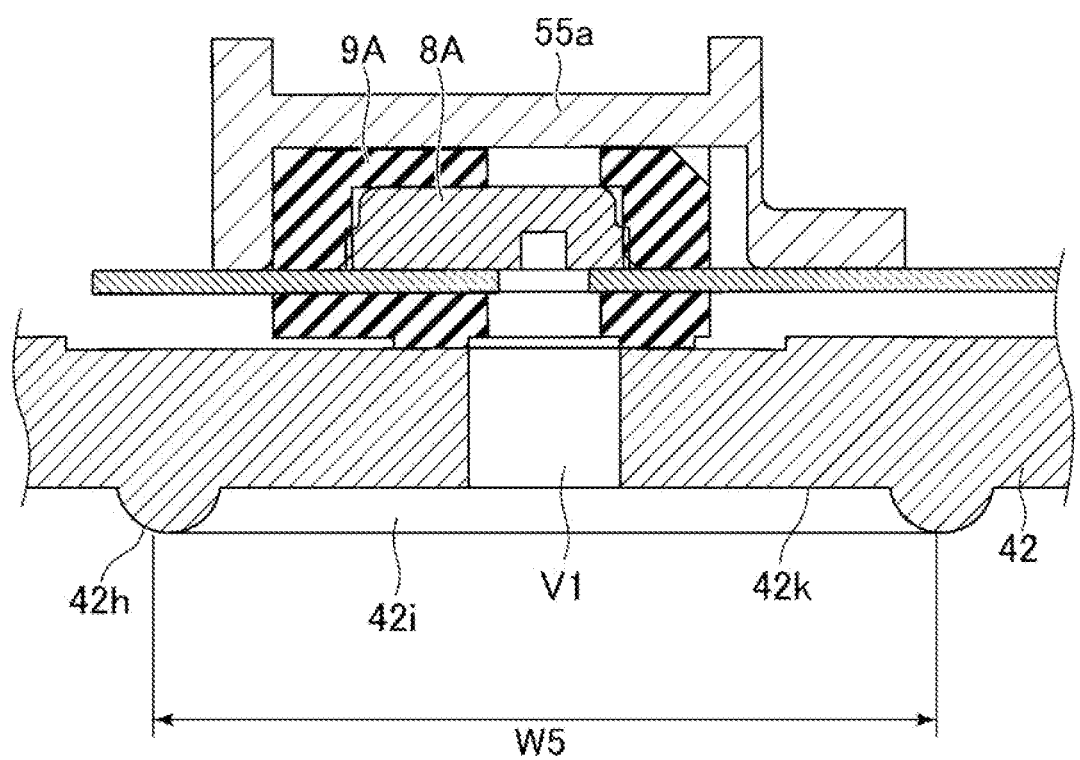
FIG. 11B is a sectional view taken along line XI-XI of FIG. 11A.

Note that, around the first sound hole V1, instead of the recessed portion 42*f*, one or a plurality of projected portions surrounding the first sound hole V1 may be formed. FIG. 11A and FIG. 11B are sectional views illustrating such a modified example. FIG. 11A is a sectional view obtained from a cross section like the one in FIG. 9. FIG. 11B is a sectional view taken along line XI-XI illustrated in FIG. 11A.

In the example illustrated in FIG. 11A and FIG. 11B, a projected portion 42*h* is formed around the first sound hole V1. The projected portion 42*h* is hereinafter referred to as "protection projected portion." The first sound hole V1 is positioned inside a region surrounded by the protection projected portion 42h. An inner surface 42i of the protection projected portion 42h functions as a wall surrounding the first sound hole V1. With the protection projected portion 42h formed in this manner, the entrance of the first sound hole V1 can be suppressed by the protection projected portion 42h from being entirely covered by the fingers, and a sudden change in air pressure in the first sound hole V1 can thus be suppressed.

A size of the region formed inside the protection projected portion 42h may be the same as a size of the region formed inside the above-mentioned protection recessed portion 42f. Specifically, a width in one of two orthogonal directions may be smaller than a width in the other direction. Specifically, a width W5 in the left-right direction (see FIG. 11B) is larger than a width W6 in the forward-rearward direction (see FIG. 11A). The small width W6 is smaller than 3 mm, for example. The small width W6 may be smaller than 2 mm. The large width W5 is larger than 7 mm, for example. The large width W5 may be larger than 9 mm.

In still another example, a plurality of projected portions may be formed around the first sound hole V1 to surround the first sound hole V1 as a whole. In this case, a length (width in the left-right direction) of a region surrounded by the plurality of projected portions may be larger than a width thereof in the forward-rearward direction. Also with such a structure, the entrance of the first sound hole V1 can be prevented from being entirely covered by the fingers, and a sudden change in air pressure in the first sound hole V1 can thus be suppressed.

[Reduction of Input Stick Operation Sound]

Figure 14A:
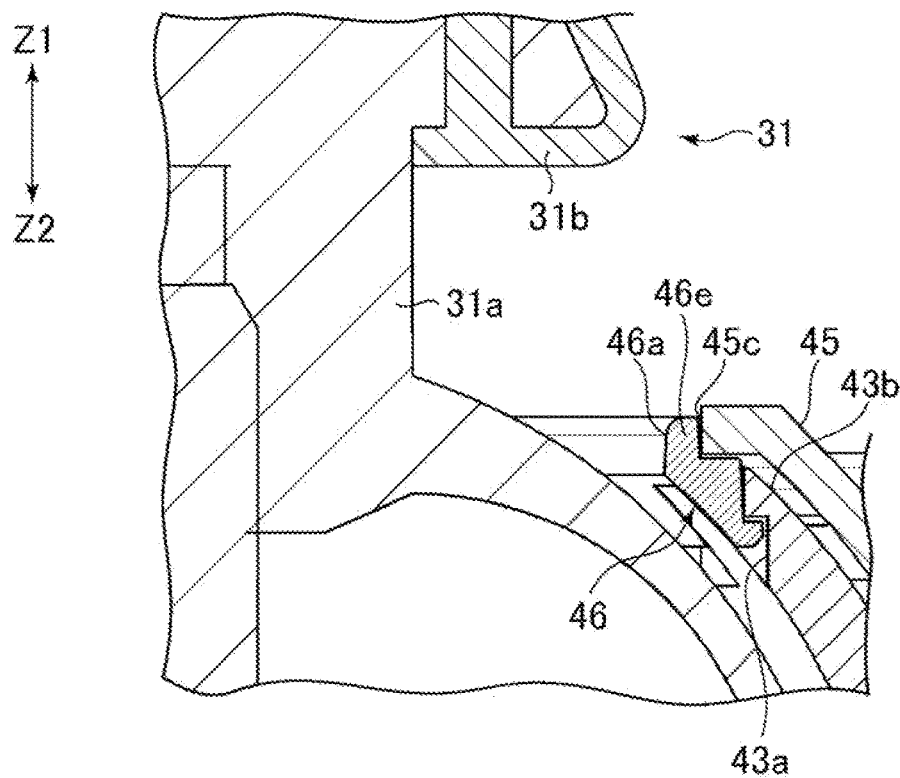
FIG. 14A is a sectional view of the input device taken along line XIVa-XIVa illustrated in FIG. 13B.

The input device 10 includes, as its exterior members, the upper cabinet section 41 and the cover 45 described above. The upper cabinet section 41 has openings 43a (see FIG. 6), and the cover 45 has openings 45c (see FIG. 7). Inside the openings 43a and 45c, the input sticks 31 can each tilt in the radial direction or tilt and pivot around the center line of the initial position. As illustrated in FIG. 14A, the input stick 31 has a pillar portion 31a and a contact portion 31b positioned above the pillar portion 31a. A lower portion of the pillar portion 31a is supported by a support mechanism, which is not illustrated.

As illustrated in FIG. 14A, a buffer member 46 is provided on inner edges of the openings 43a and 45c. The buffer member 46 is made of a material different from materials of the inner edges of the openings 43a and 45c (that is, a material of the upper cabinet section 41 and a material of the cover 45) and also different from a material of the input stick 31 (more specifically, a material of an outer peripheral surface of the pillar portion 31a). The buffer member 46 protrudes inward from the inner edges of the openings 43a and 45c. Thus, when the input stick 31 tilts, the pillar portion 31a collides with not the inner edges of the openings 43a and 45c but the buffer member 46. With the buffer member 46, sound generation due to collisions between the pillar portion 31a of the input stick 31 and the inner edges of the openings 43a and 45c can be prevented, and noise generation in voice data that is obtained from the microphones 8A and 8B can thus be suppressed.

The material of the buffer member 46 may be a material lower in rigidity than the materials of the inner edges of the openings 43a and 45c and the material of the input stick 31. The materials of the inner edges of the openings 43a and 45c, that is, the material of the upper cabinet section 41, the material of the cover 45, and the material of the pillar portion 31a of the input stick 31 are an acrylonitrile butadiene styrene (ABS) resin or a polycarbonate resin, for example.

The material of the buffer member 46 is a material containing a resin mixed with an additive (for example, sliding material), for example.

Figure 13A:
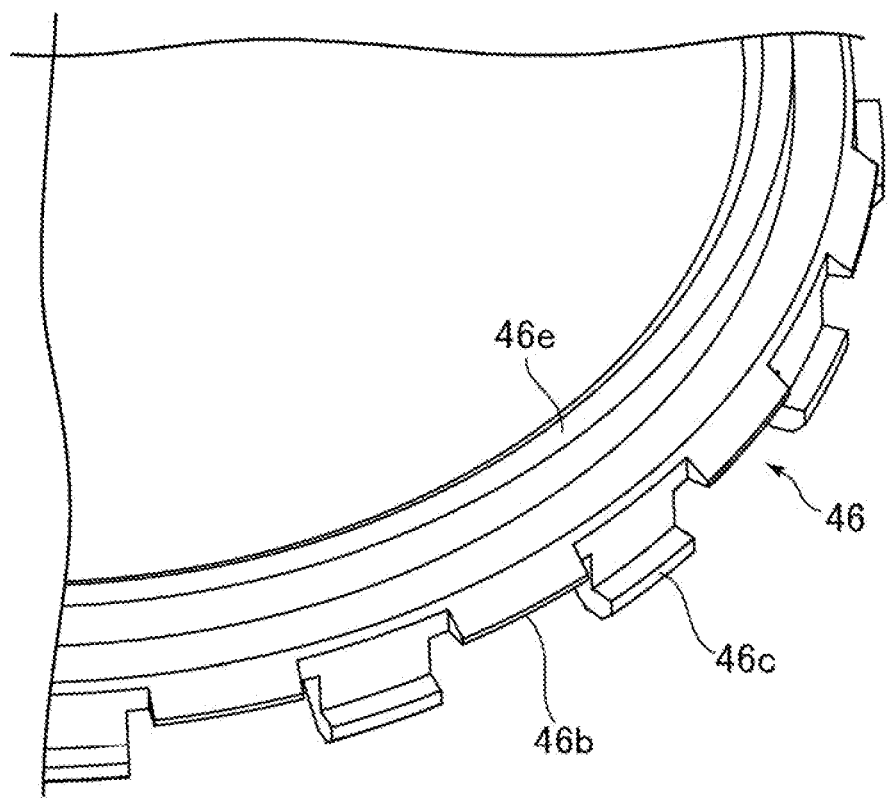
FIG. 13A is a perspective view illustrating the buffer member in an enlarged manner.
Figure 13B:
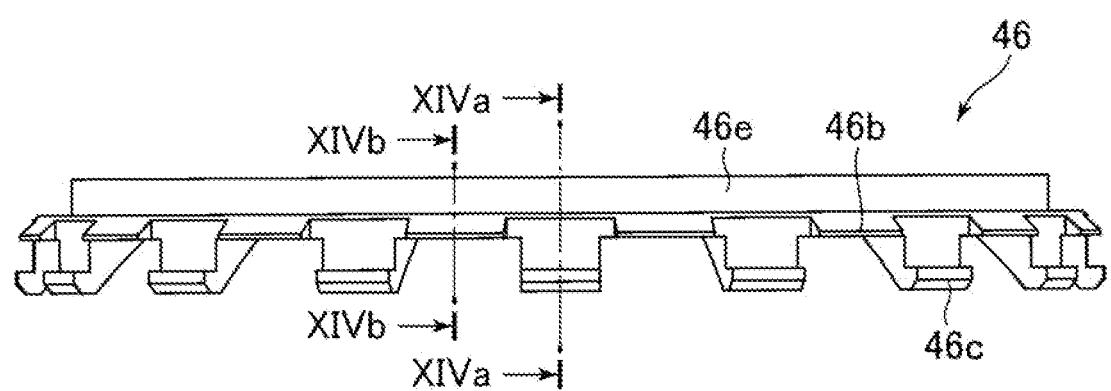
FIG. 13B is a side view of the buffer member.

As illustrated in FIG. 13A and FIG. 13B, the buffer member 46 is annular. The buffer member 46 has a contact surface 46a in contact with the outer peripheral surface of the pillar portion 31a of the input stick 31. The contact surface 46a extends over the entire circumferences of the openings 43a and 45c. This makes it possible to smoothly operate, in a state in which the input stick 31 tilts to be in contact with the contact surface 46a, the tilted input stick 31 to pivot.

In the example of the input device 10, the buffer member 46 is a member molded separately from the upper cabinet section 41 and the cover 45. That is, a molding step for molding the buffer member 46, a molding step for molding the upper cabinet section 41, and a molding step for molding the cover 45 are performed separately. Further, the buffer member 46 is attached to the inner edges of the openings 43a and 45c. With the buffer member 46 molded separately from the upper cabinet section 41 and the cover 45 in this way, the steps of molding the buffer member 46 and the upper cabinet section 41 can be simplified.

In the example of the input device 10, the buffer member 46 is attached to the inner edge of the opening 43a of the upper cabinet section 41. The buffer member 46 has, as illustrated in FIG. 13A and FIG. 13B, upper engagement portions 46b and lower engagement portions 46c that sandwich the inner edge of the opening 43a in the upward-downward direction. The upper engagement portions 46b and the lower engagement portions 46c are alternately arranged in a circumferential direction. The upper engagement portions 46b are positioned above the inner edge of the opening 43a, and the lower engagement portions 46c are positioned below the inner edge of the opening 43a.

Figure 12:
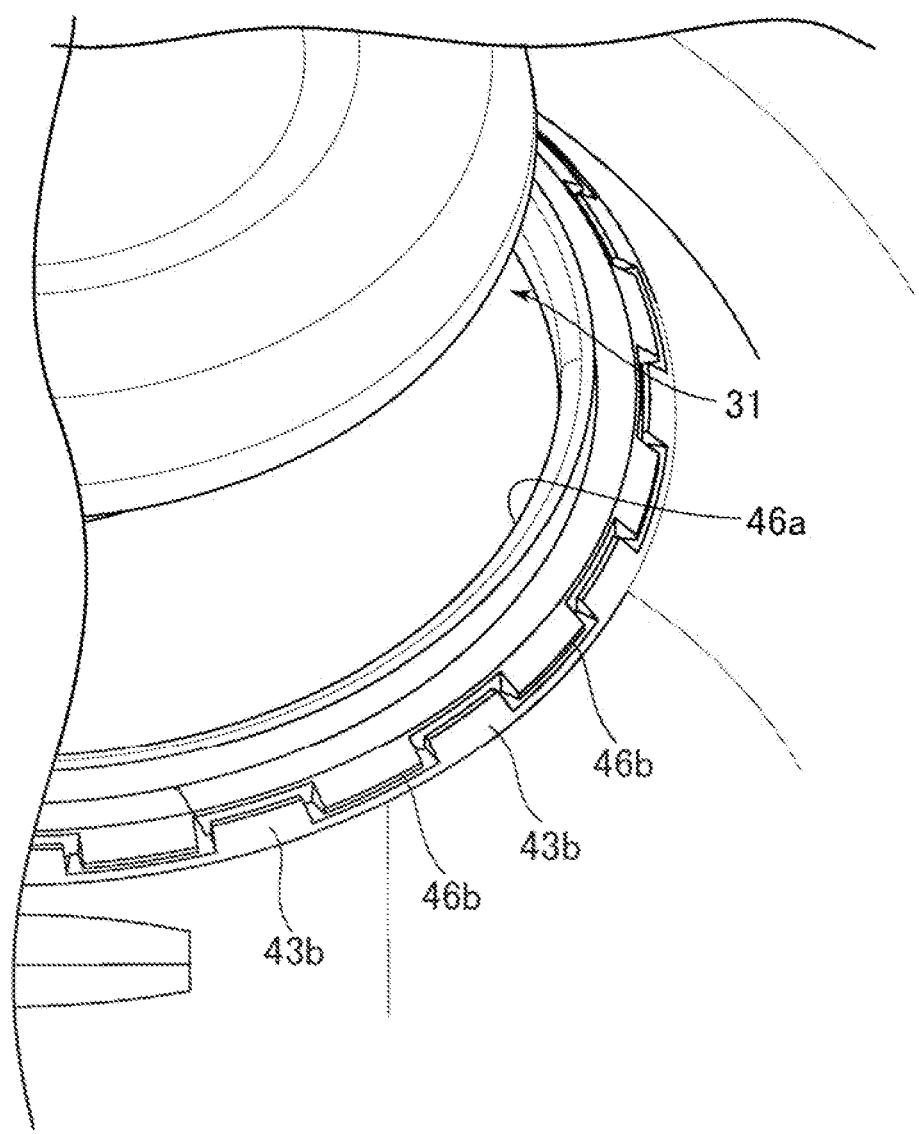
FIG. 12 is a perspective view illustrating a buffer member attached to the upper cabinet section.

The upper engagement portions 46b each protrude radially outward from an annular portion 46e of the buffer member 46. On the inner edge of the opening 43a of the upper cabinet section 41, a plurality of engagement portions 43b (see FIG. 12) protruding upward are formed. The engagement portions 43b are arranged at intervals in the circumferential direction of the opening 43a. The upper engagement portion 46b is fitted between adjacent two engagement portions 43b. This engagement structure of the buffer member 46 and the inner edge of the opening 43a regulates rotation of the buffer member 46. For example, when the input stick 31 in abutment against the buffer member 46 is moved in the circumferential direction, the upper engagement portions 46b of the buffer member 46 collide with the engagement portions 43b of the opening 43a, so that the buffer member 46 can be prevented from shifting in position. The interval between adjacent two engagement portions 43b desirably matches a width of the upper engagement portion 46b of the buffer member 46.

Note that, the engagement structure of the buffer member 46 and the inner edge of the opening 43a is not limited to the example in the input device 10. For example, a plurality of engagement portions protruding inward may be formed at the inner edge of the opening 43a. The engagement portions may be fitted into the annular portion 46e of the buffer member 46. Also with this structure, the buffer member 46 can be prevented from shifting in position when the input stick 31 tilting in the radial direction pivots.

The cover 45 has the openings 45c in which the input sticks 31 are disposed. With this structure, the engagement structure between the buffer member 46 and the inner edge of the opening 43a of the upper cabinet section 41 (between the upper engagement portions 46b and the engagement portions 43b) can be covered by the cover 45. As a result, the appearance of the input device 10 can be further enhanced.

Figure 14B:
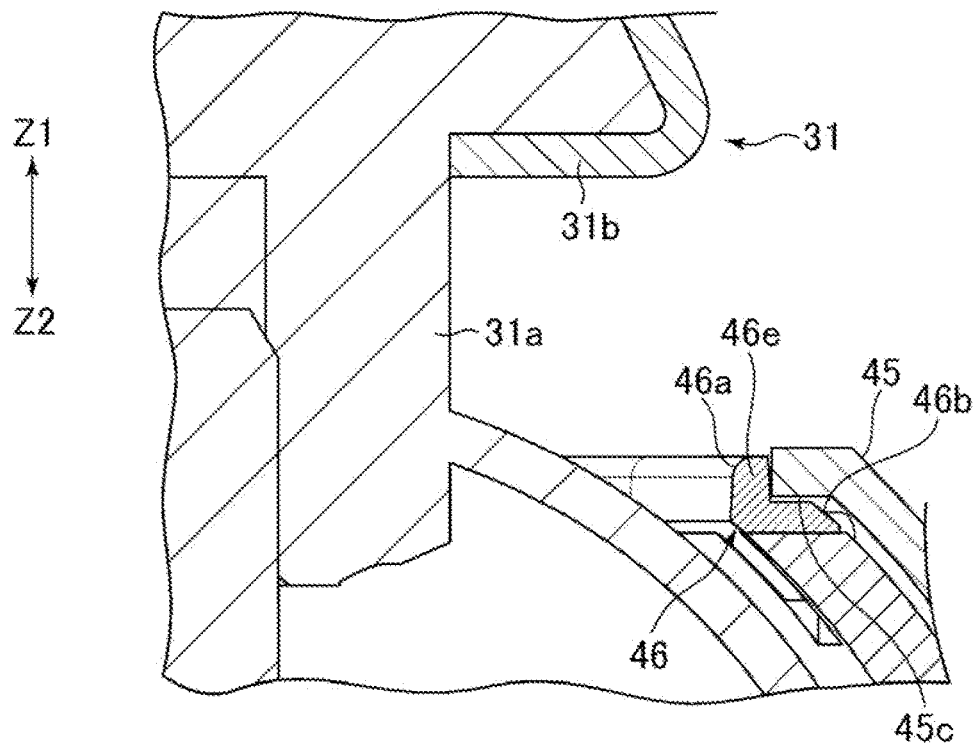
FIG. 14B is a sectional view of the input device taken along line XIVb-XIVb illustrated in FIG. 13B.

As illustrated in FIG. 14A and FIG. 14B, the edge of the opening 45c of the cover 45 is positioned above the upper engagement portions 46b of the buffer member 46 and the engagement portions 43b of the upper cabinet section 41. Meanwhile, the annular portion 46e of the buffer member 46 is positioned on an inner side of the inner edge of the opening 45c of the cover 45. With this structure, the engagement structure between the inner edge of the opening 43a of the upper cabinet section 41 and the buffer member 46 can be prevented by the cover 45 from being exposed.

Unlike the example of the input device 10, the buffer member 46 may be attached to the inner edge of the opening 45c of the cover 45. In this case, the contact surface 46a, which is an inner surface of the annular portion 46e of the buffer member 46, preferably protrudes inward from the inner edge of the opening 43a of the upper cabinet section 41.

Figure 15:
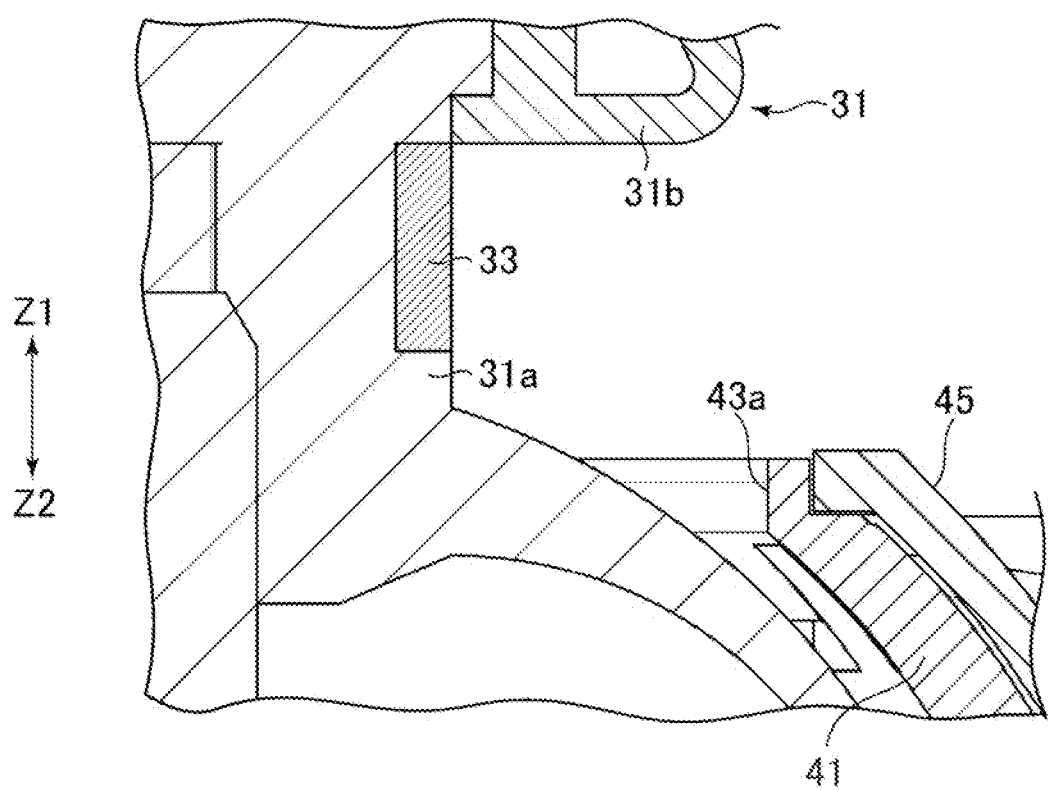
FIG. 15 is a sectional view of a modified example of the buffer member.

In still another example, a buffer member may be provided to the input stick 31. More specifically, as illustrated in FIG. 15, a buffer member 33 may be provided on the outer peripheral surface of the pillar portion 31a of the input stick 31. The buffer member 33 may be made of a material different from the material of the pillar portion 31a, the material of the upper cabinet section 41, and the material of the cover 45. For example, the material of the buffer member 33 may be a material lower in rigidity than the materials of these components. The buffer member 33 may be formed together with the pillar portion 31a by two-color molding. Two-color molding is a method of obtaining a molded article by sequentially injecting two different resins into a mold as materials. Unlike this, the buffer member 33 may be molded separately from the pillar portion 31a and attached to the outer peripheral surface of the pillar portion 31a.

[Reduction of Button Operation Sound]

Figure 17:
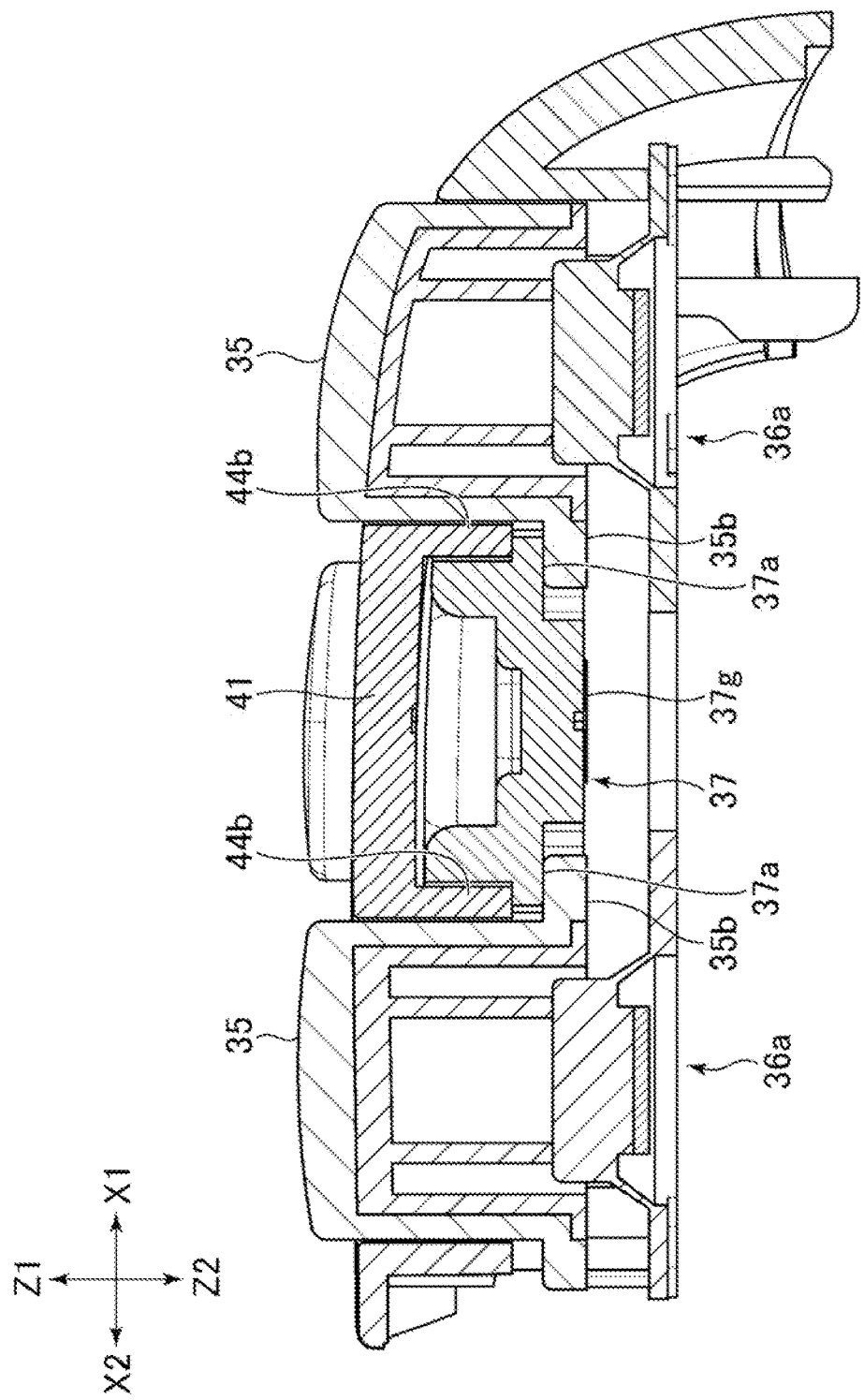
FIG. 17 is a sectional view taken along line XVII-XVII illustrated in FIG. 1A.

The upper cabinet section 41 has a plurality of openings 44a (see FIG. 6). The input buttons 35 are disposed inside the respective openings 44a. The input buttons 35 are each movable in a direction intersecting with the upper cabinet section 41, that is, in the upward-downward direction. As illustrated in FIG. 17, a switch 36a is disposed below the input button 35. The switch 36a is made of an elastic material (for example, rubber), and biases the input button 35 upward toward an initial position.

The input button 35 has, on its base portion, stopped portions 35b and 35c (see FIG. 16B) for preventing the input button 35 from popping out of the opening 44a. The stopped portions 35b and 35c are projected portions protruding from a lower edge of the input button 35 in a radial direction of the input button 35, for example.

Figure 16A:
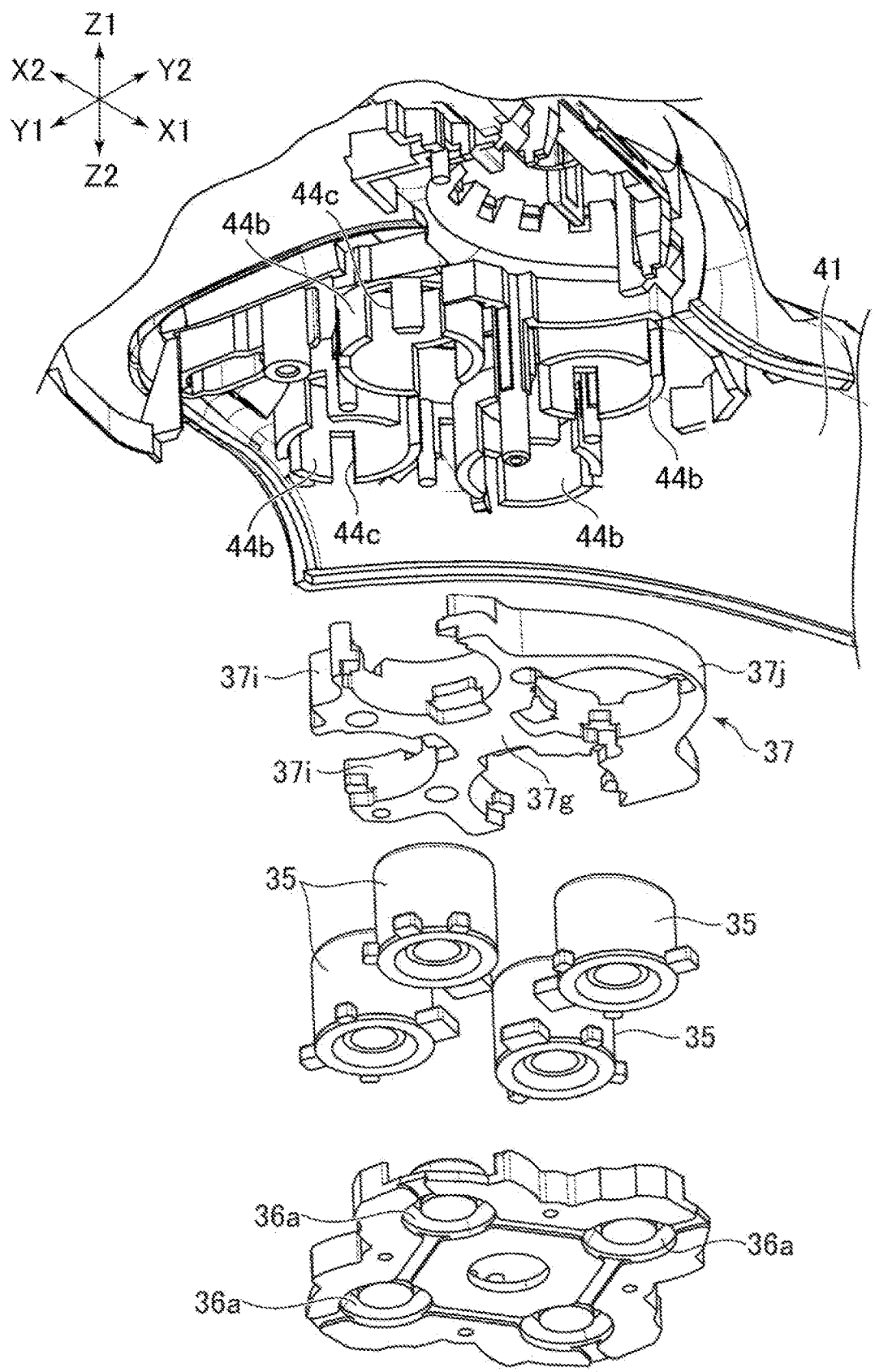
FIG. 16A is an exploded perspective view illustrating input buttons, the upper cabinet section, and a buffer member.

As illustrated in FIG. 16A, the input device 10 includes a buffer member 37. A material of the buffer member 37 is different from the material of the upper cabinet section 41 and a material of the input button 35. The material of the buffer member 37 is preferably a material lower in rigidity than the material of the upper cabinet section 41 and the material of the input button 35. The material of the upper cabinet section 41 and the material of the input button 35 may be an engineering plastic, for example, a polycarbonate resin, and the material of the buffer member 37 may be a rubber, an elastomer, or the like. The buffer member 37 has stopper portions 37a and 37b (see FIG. 16B) positioned between an edge of the opening 44a and the stopped portions 35b and 35c of the input button 35.

When the input button 35 is pressed, the switch 36a is depressed, so that an on state is established. When a force pressing the input button 35 is released, the input button 35 is pushed up by an elastic force of the switch 36a, with the result that the stopped portions 35b and 35c collide with the respective stopper portions 37a and 37b. With the buffer member 37, sound generation due to collisions between the stopped portions 35b and 35c and the edge of the opening 44a can be prevented. As a result, noise generation in voice data that is acquired by the microphones 8A and 8B can be prevented.

Figure 16B:
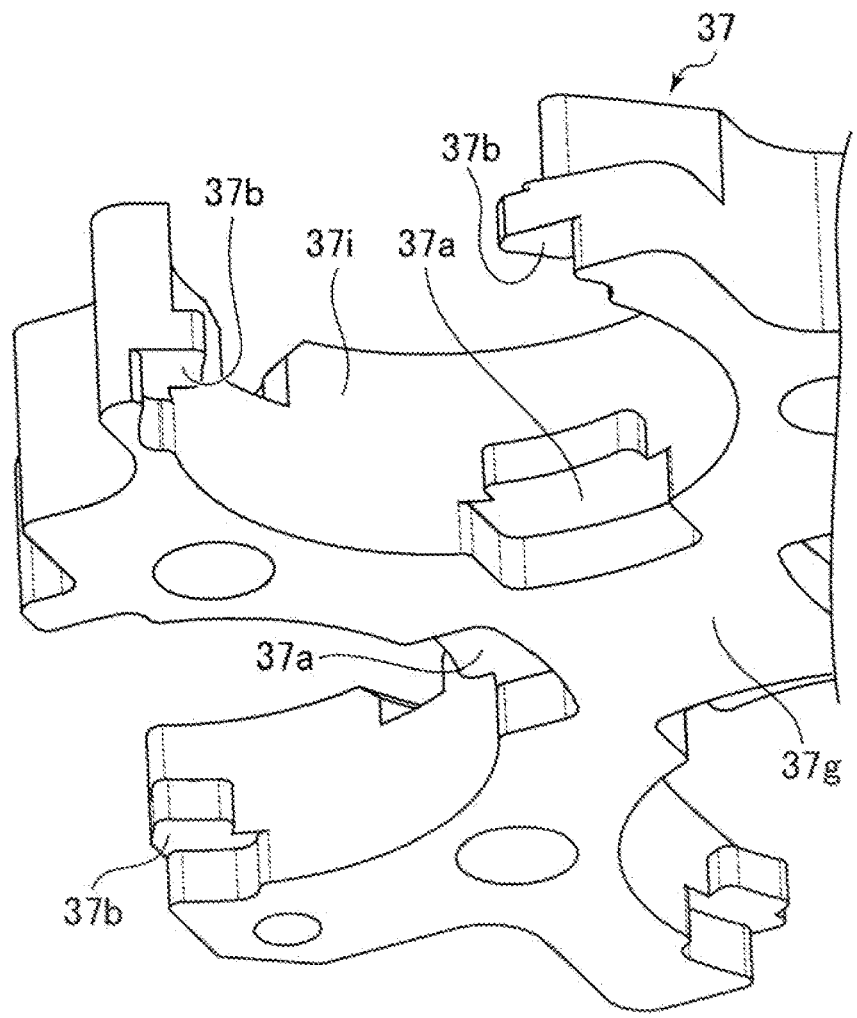
FIG. 16B is an enlarged view of FIG. 16A.
Figure 16B:
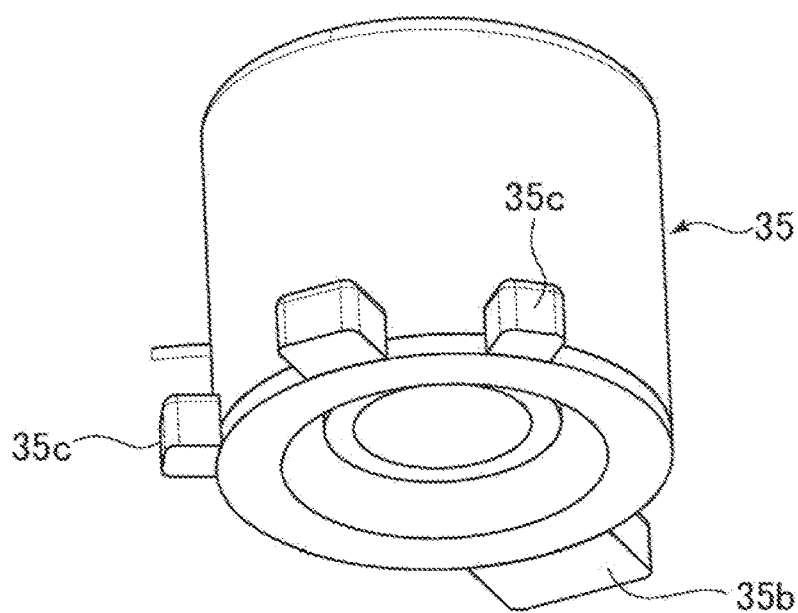

As illustrated in FIG. 16B, the stopped portions 35b and 35c are disposed in the circumferential direction of the input button 35 in a distributed manner. With this, the input button 35 can be prevented from tilting when the stopped portions 35b and 35c hit the stopper portions 37a and 37b. For example, the plurality of stopped portions 35b and 35c are disposed at equal intervals in the circumferential direction.

The plurality of input buttons 35 are disposed on the upper surface of the held section 10R. Specifically, the four input buttons 35 are disposed at the end portions of the cross. The input device 10 includes the buffer member 37 common to the four input buttons 35. That is, the single buffer member 37 has the stopper portions 37a and 37b corresponding to each of the four input buttons 35. With this structure, the number of parts can be reduced, and the assembly of the input device 10 can thus be simplified. Further, a space for disposing the buffer member 37 can be reduced.

The upper cabinet section 41 may have guide cylinders 44b extending downward at the edges of the openings 44a. The input button 35 is movable inside the guide cylinder 44b in the upward-downward direction. The guide cylinder 44b has grooves 44c (see FIG. 16A) into which the stopped portions 35b and 35c protruding from the input button 35 in the radial direction are to be fitted. The stopped portions 35b and 35c are movable in the upward-downward direction along the grooves 44c. With this structure, rotation of the input button 35 inside the guide cylinder 44b is regulated. Thus, the stopped portions 35b and 35c have a function of regulating the rotation of the input button 35 and a function of reducing noise by colliding with the buffer member 37.

The buffer member 37 has a center portion 37g (see FIG. 16B) positioned at a center of the four input buttons 35 (a center of the four guide cylinders 44b). The stopped portions 35b of the four input buttons 35 protrude toward the center of the four input buttons 35. The buffer member 37 has, in the center portion 37g, the four stopper portions 37a corresponding to the respective four input buttons 35. The stopped portions 35b of the four input buttons 35 collide with the respective four stopper portions 37a.

Further, the buffer member 37 has annular portions 37i and 37j surrounding an outer side of the guide cylinder 44b. As illustrated in FIG. 16B, the stopper portions 37b are formed on the annular portions 37i and 37j. The stopper portions 37b are formed at positions away from the stopper portion 37a in the center portion 37g.

Note that, the arrangement of the input buttons 35 with the buffer member 37 is not limited to the example in the input device 10. For example, the number of input buttons 35 may be two or three. In a case where the number of input buttons 35 is two, the buffer member 37 may have a center portion between the two input buttons 35, and the stopper portions 37a may be formed in the center portion.

[Damper of Circuit Board]

The input device 10 includes the vibration motors 5L and 5R disposed on the left and right held sections 10L and 10R (more specifically, on the grips 12). The vibration motors 5L and 5R drive in response to an instruction from the information processing apparatus (video game console), for example, to vibrate the grips 12. The vibration motors 5L and 5R may be linear motors (for example, voice coil motors) or rotary motors (for example, direct-current (DC) motors). As illustrated in FIG. 2, the vibration motors 5L and 5R are held by the frame 51. The frame 51 has motor holding portions 51c in portions accommodated in the left and right grips 12.

As illustrated in FIG. 2, the circuit board 61 is positioned below the frame 51 (first support member) and attached to the frame 51 in the upward-downward direction. The circuit board 61 is attached to the frame 51 with a fixture (specifically, screw 69 (see FIG. 5)), for example. In the example of the input device 10, the screw 69 is covered by the battery 62 disposed below the circuit board 61.

Figure 5:
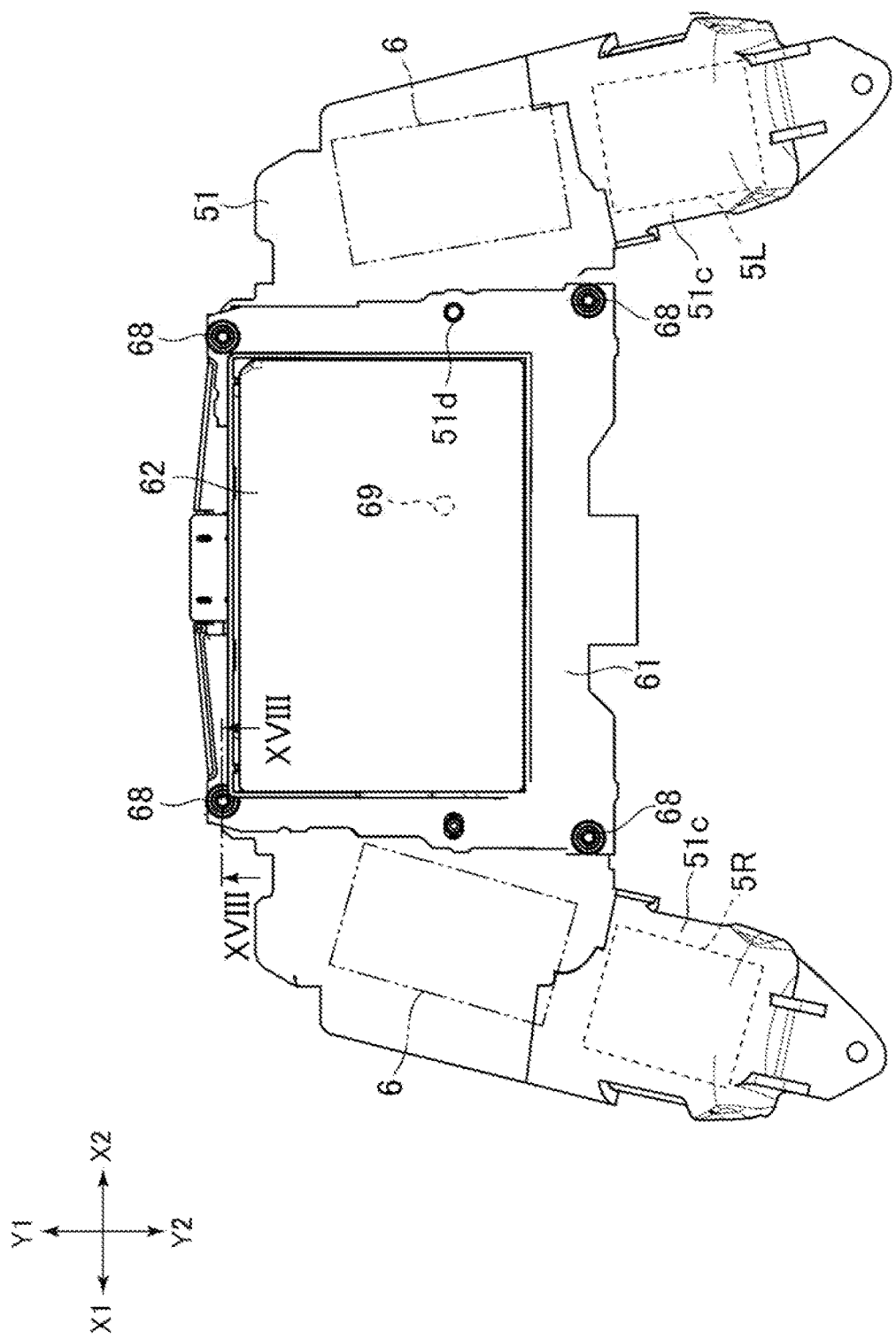
FIG. 5 is a bottom view illustrating a circuit board and a frame.
Figure 18:
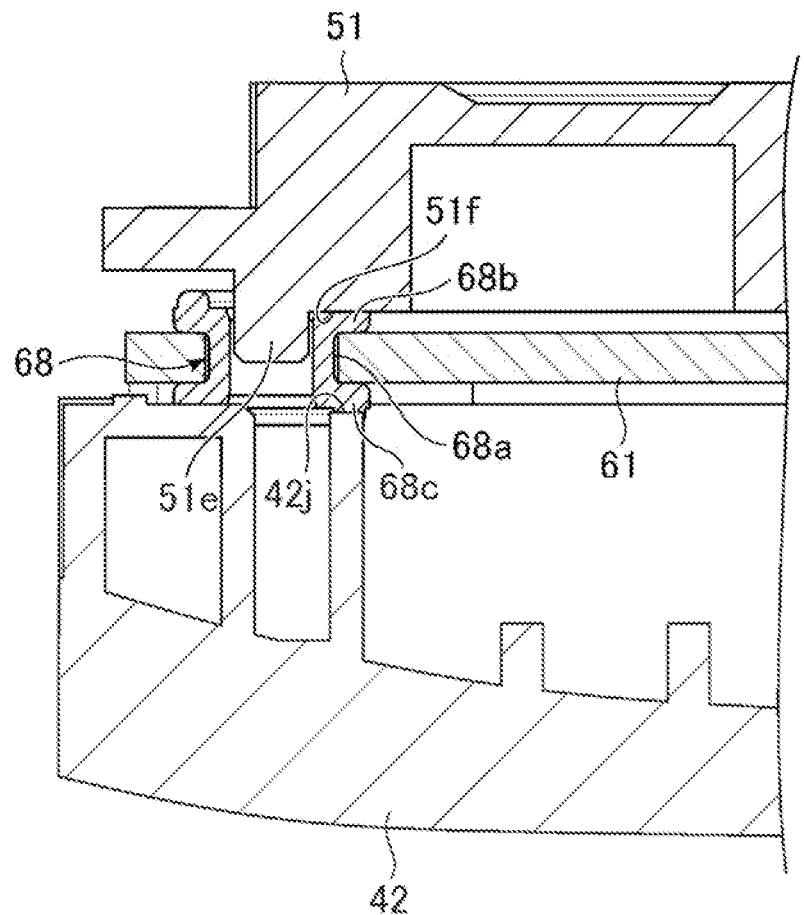
FIG. 18 is a sectional view illustrating the circuit board and the frame in cross section along line XVIII-XVIII illustrated in FIG. 5.

As illustrated in FIG. 18, dampers 68 are disposed between the circuit board 61 and the frame 51. The dampers 68 are each made of an elastic material, for example, a rubber or an elastomer. The damper 68 is disposed at a position (damper position) away from a position at which the screw 69 is disposed (fixed position). As illustrated in FIG. 5, the dampers 68 are located at a plurality of positions surrounding the screw 69. In the example of the input device 10, the dampers 68 are disposed at four corner portions of the circuit board 61.

As described above, the input device 10 includes the vibration motors 5L and 5R and the microphones 8A and 8B. When the vibration motors 5L and 5R drive to vibrate the circuit board 61 and contact sound is generated between the circuit board 61 and the frame 51, the contact sound is acquired by the microphones 8A and 8B as noise in voice data. Even in a case where the circuit board 61 is fixed to the frame 51 with screws at a plurality of positions, minute gaps may be formed between the circuit board 61 and the frame 51 due to a difference between a coefficient of thermal expansion of the circuit board 61 and a coefficient of thermal expansion of the frame 51. When the vibration motors 5L and 5R drive with such gaps, contact sound, which is noise, is generated between the circuit board 61 and the frame 51.

In the example of the input device 10, since the dampers 68 are disposed between the circuit board 61 and the frame 51, such noise generation can be suppressed. In particular, in the example of the input device 10, the dampers 68 are disposed to surround the fixed position (the position of the screw 69), so that contact sound generation that occurs when the circuit board 61 is brought into contact with the frame 51 due to the vibration of the vibration motors 5L and 5R can be effectively suppressed. For example, contact sound generation that occurs between the circuit board 61 and the frame 51 when the corner portions of the circuit board 61 are vibrated can be effectively suppressed.

Note that, as screws provided to the circuit board 61, the single screw 69 is sufficient. With this, even in a case where the circuit board 61 and the frame 51 are thermally expanded, the screw 69 can be suppressed from being loosed due to the thermal expansion. Note that, the damper 68 may not be provided at the position at which the screw 69 is provided, that is, the fixed position. At the fixed position, the circuit board 61 may be in direct contact with the frame 51. Further, the circuit board 61 may have a hole into which a positioning protrusion 51d formed on the frame 51 is fitted.

The circuit board 61 has holes 61b (see FIG. 3). The holes 61b may be formed at an outer edge of the circuit board 61, for example. That is, an edge of each of the holes 61b may be partly open. As illustrated in FIG. 18, the damper 68 has a cylindrical body portion 68a fitted into the hole 61b of the circuit board 61. Further, the damper 68 has an upper flange portion 68b formed on an edge portion (an upper edge) of the body portion 68a, and a lower flange portion 68c formed on the other edge portion (a lower edge) of the body portion 68a.

As illustrated in FIG. 18, the frame 51 has a projected portion 51e fitted into the cylindrical body portion 68a. In a case where the vibration motors 5L and 5R drive to relatively vibrate the circuit board 61 and the frame 51 in a direction along the circuit board 61, the projected portion 51e of the frame 51 collides with the damper 68 in the direction along the circuit board 61.

Further, as illustrated in FIG. 18, the upper flange portion 68b is sandwiched between the circuit board 61 and the frame 51 in the upward-downward direction. In other words, the upper flange portion 68b is sandwiched between the circuit board 61 and the frame 51 in an attachment direction of the circuit board 61 and the frame 51. Thus, noise generation due to collisions between parts of the circuit board 61, specifically, the corner portions of the circuit board 61 and the frame 51 in the attachment direction of the circuit board 61 and the frame 51 can be suppressed.

In this way, in the example of the input device 10, the damper 68 has the portion sandwiched in the attachment direction of the circuit board 61 and the frame 51 (the upper flange portion 68b) and the portion sandwiched in a direction orthogonal to the attachment direction (the direction along circuit board 61) (the body portion 68a). With this, a collision between the circuit board 61 and the frame 51 can be effectively suppressed.

Note that, a shape of the damper 68 is not limited to the example in the input device 10. For example, the frame 51 may not have the projected portion 51e. In this case, the body portion 68a of the damper 68 may not be cylindrical. For example, the body portion 68a may be columnar. The flange portions 68b and 68c may be formed at edge portions of the columnar body portion 68a.

The input device 10 includes the lower cabinet section 42 (second support member) on the side opposite to the frame 51 across the circuit board 61. As illustrated in FIG. 18, the damper 68 has the portion sandwiched between the lower cabinet section 42 and the circuit board 61. Specifically, the above-mentioned lower flange portion 68c is sandwiched between the lower cabinet section 42 and the circuit board 61. Thus, contact sound generation that occurs between the circuit board 61 and the lower cabinet section 42 due to the vibration of the circuit board 61 can be suppressed.

As illustrated in FIG. 18, the frame 51 has a contact portion 51f in contact with the upper flange portion 68b of the damper 68. The lower cabinet section 42 has a contact portion 42j in contact with the lower flange portion 68c of the damper 68. The contact portion 51f of the frame 51 and the contact portion 42j of the lower cabinet section 42 face each other in the upward-downward direction. Thus, sufficient contact pressures can be secured between the frame 51 and the damper 68 and between the lower cabinet section 42 and the damper 68. In the example of the input device 10, the contact portion 42j of the lower cabinet section 42 is a cylindrical portion protruding upward, and an upper edge of the contact portion 42j is in contact with the lower flange portion 68c of the damper 68.

Note that, the input device 10 may include, for each of the plurality of dampers 68 provided on the circuit board 61, the structure described with reference to FIG. 18, that is, the body portion 68a, the flange portions 68b and 68c, and the contact portions 42j and 51f.

As described above, the vibration motors 5L and 5R are disposed in the grips 12 and positioned at the rear edges of the left and right held sections 10L and 10R. The circuit board 61 is accommodated in the device center section 10M positioned between the left and right held sections 10L and 10R. The circuit board 61 is positioned in front of the vibration motors 5L and 5R when seen from a bottom surface of the input device 10 (see FIG. 5). The dampers 68 are positioned at the corner portions of the circuit board 61. The damper 68 positioned at each rear corner portion is positioned between the fixed position at which the screw 69 is provided and the vibration motor 5L and 5R when seen from the bottom surface of the input device 10. In other words, a straight line connecting the screw 69 to the damper 68 intersects with the vibration motor 5L and 5R. With the dampers 68 and the vibration motors 5L and 5R disposed in this way, contact sound generation at positions near the vibration motors 5L and 5R can be suppressed.

As described above, the vibration motors 5L and 5R are voice coil motors, for example. In this case, a vibration direction of vibrators (that is, movable portions) of the vibration motors 5L and 5R may intersect with the attachment direction of the circuit board 61 and the frame 51 (the upward-downward direction). In the example of the input device 10, the vibrator is disposed to vibrate in an extending direction of the grip 12, and vibrates in an oblique forward-rearward direction. Thus, the corner portions of the circuit board 61 can be suppressed from being largely vibrated in the attachment direction of the circuit board 61 and the frame 51 (the upward-downward direction) when the vibration motors 5L and 5R drive.

The input device 10 includes the microphones 8A and 8B disposed in the device center section 10M. The microphones 8A and 8B are disposed above or below the circuit board 61 to be away from the circuit board 61, and are supported by members different from the circuit board 61 and the frame 51. Specifically, as illustrated in FIG. 9, the second microphone 8B is supported by not the frame 51 but the upper cabinet section 41, and is in contact with the inner surface of the cover 45 through the microphone holder 9B. Further, the first microphone 8A is supported by the microphone support portion 55a formed at the rear edge of the battery holder 55, which supports the battery 62, and is in abutment against the inner surface of the lower cabinet section 42 through the microphone holder 9A.

Note that, the support structure of the circuit board 61 is not limited to the example in the input device 10. For example, the input device 10 may not include the frame 51. In this case, the circuit board 61 may be attached to the lower cabinet section 42. Further, one of the flange portions of the damper 68 may be sandwiched between the lower cabinet section 42 and the circuit board 61, and the other flange portion of the damper 68 may be sandwiched between the upper cabinet section 41 and the circuit board 61.

[Light Emitting System]

The upper surface of the input device 10 has a right region in which the input buttons 35 are disposed (the upper surface of the right held section 10R), a left region in which the directional pad 19 is disposed (the upper surface of the left held section 10L), and a center region that is a region between the right and left regions. In the example of the input device 10, the upper surface of the input member 20 forms the center region. The input member 20 is positioned in a front portion of the device center section 10M, and a front edge of the input member 20 forms a front edge of the input device 10. A frontmost portion of the input member 20 is bent downward to form a front surface of the input device 10. The upper cabinet section 41 has an opening 41h (see FIG. 6). The input member 20 is disposed inside the opening 41h of the upper cabinet section 41.

Figure 20:
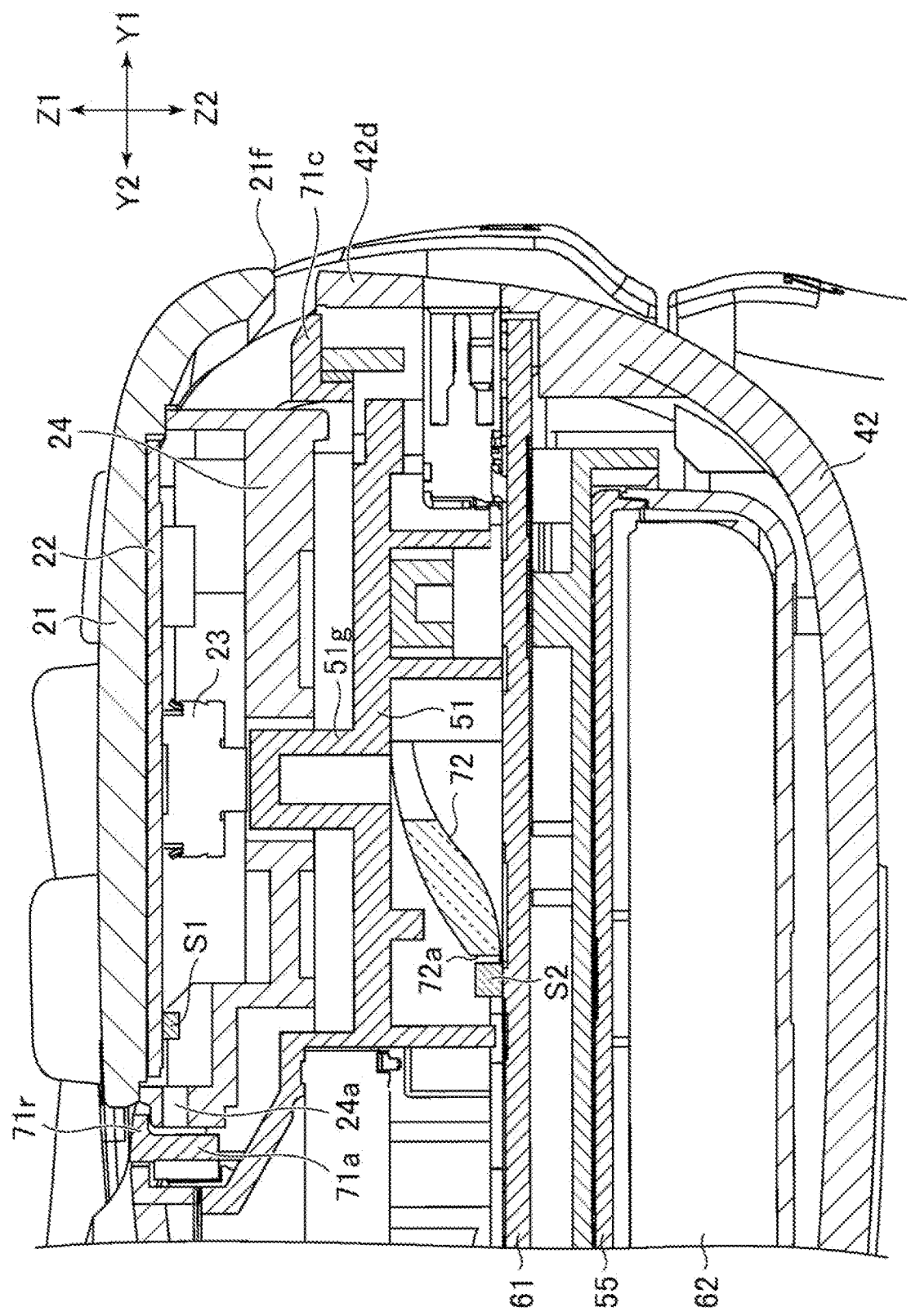
FIG. 20 is a sectional view taken along line XX-XX illustrated in FIG. 1A.

As illustrated in FIG. 20, the input member 20 includes a surface panel 21 forming the upper surface of the input device 10 and a circuit board 22 attached to a lower surface of the surface panel 21. The touch sensor is disposed between the circuit board 22 and the surface panel 21. The input member 20 may include a frame 24 attached to the surface panel 21 to cover a lower side of the circuit board 22.

Further, the input member 20 is supported to be movable in the upward-downward direction, thereby functioning as a button. In the example of the input device 10, the switch 23 is mounted on a lower surface of the circuit board 22. Meanwhile, the frame 51 disposed below the input member 20 has a press portion 51g protruding upward at a position corresponding to the switch 23. When the input member 20 is pressed, the press portion 51g presses the switch 23. The switch 23 may be mounted on the circuit board 61. In this case, the input member 20 may have a press portion.

Note that, the structure of the input member 20 is not limited to the example in the input device 10. For example, the input member 20 may be configured with the touch sensor but without the button function. In contrast, the input member 20 may be configured with the button function but without the touch sensor.

Figure 19:
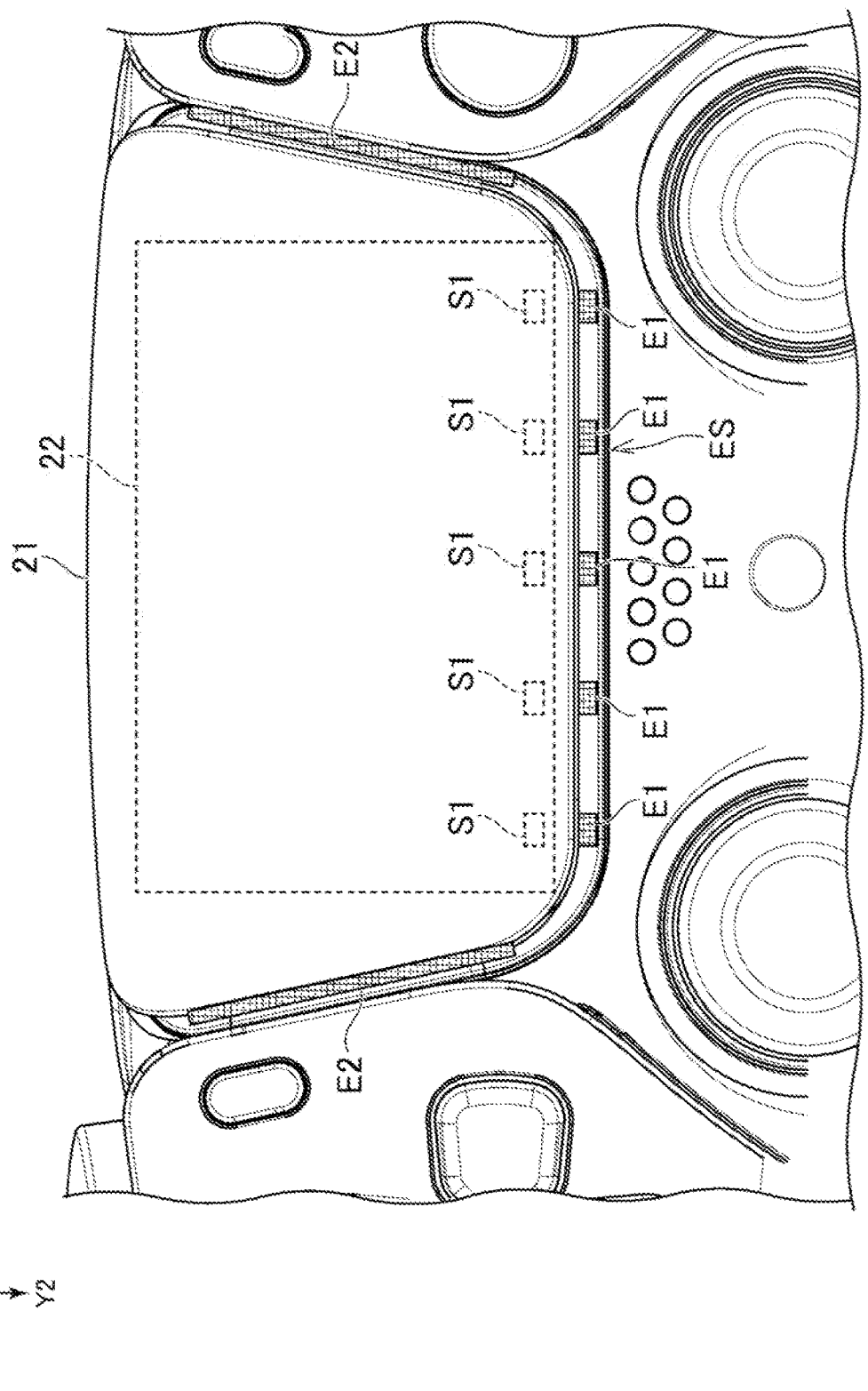
FIG. 19 is a plan view of an input member.

As illustrated in FIG. 19, the input device 10 has a light emitting region Es formed along an outer edge of the input member 20. The light emitting region Es has a plurality of first light emitting portions E1 and second light emitting portions E2. The plurality of first light emitting portions E1 are light emitting portions configured to indicate identification information assigned to a plurality of input devices connected to the information processing apparatus. The second light emitting portions E2 are light emitting portions configured to emit light on the basis of information different from the identification information. A light emitting surface of a light diffusing member 71 surrounding the outer edge of the input member 20 (see FIG. 2), which is described later, forms the light emitting region Es.

Figure 22A:
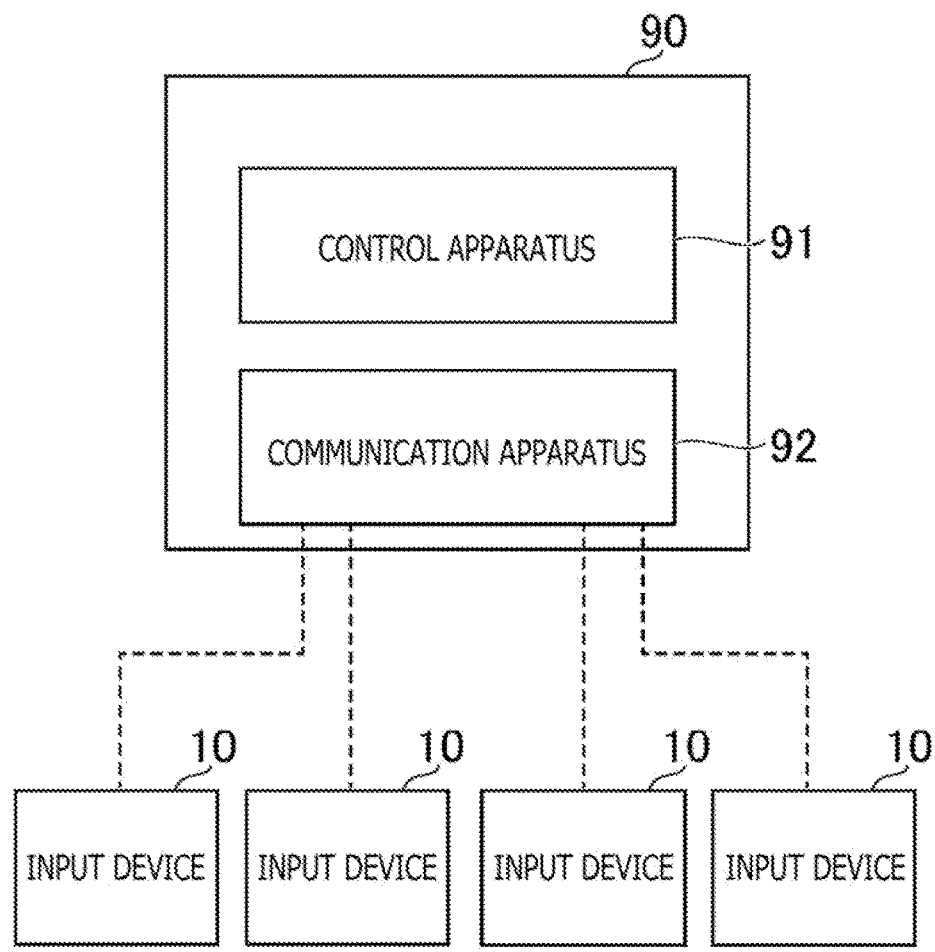
FIG. 22A is a block diagram illustrating a system including an information processing apparatus and the input device.
Figure 22B:
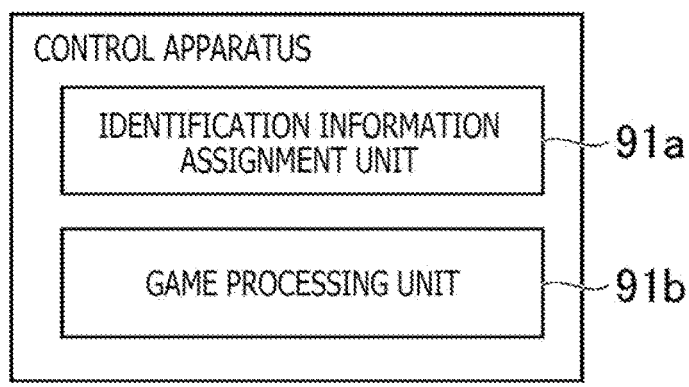
FIG. 22B is a block diagram illustrating functions of the information processing apparatus.

In an example illustrated in FIG. 22A, the plurality of input devices 10 are connected to the information processing apparatus 90 that is a video game console. The information processing apparatus 90 includes a control apparatus 91 and a communication apparatus 92. The communication apparatus 92 is an interface configured to enable wireless or wired communication with the input devices 10. The control apparatus 91 includes a microprocessor, and includes an identification information assignment unit 91a as its function as illustrated in FIG. 22B.

The identification information assignment unit 91a assigns, to the plurality of input devices 10, identification numbers as identification information identifying each of the input devices 10, in accordance with rules defined in advance. The identification information may be assigned by system software of the information processing apparatus 90 on the basis of information associated with users using the input devices 10, or on the basis of information identifying the input devices 10 themselves. Further, the identification information may be numbers, color information, character strings, or combinations of two or more of them. The identification information may take any form as long as being unique information specifying the input devices 10 or the users. The input device 10 receives an identification number assigned thereto from the information processing apparatus 90, and causes the first light emitting portions E1 to emit light on the basis of the identification number. For example, the input device 10 having 1 assigned as its identification number causes one of the plurality of first light emitting portions E1 (for example, the first light emitting portion E1 positioned at the center) to emit light. Further, the input device 10 having 2 assigned as its identification number causes two of the plurality of first light emitting portions E1 (for example, the two first light emitting portions E1 opposite to each other across the center) to emit light. The input device 10 selectively drives a plurality of first light sources S1 (see FIG. 19) corresponding to the respective first light emitting portions E1.

Meanwhile, the second light emitting portions E2 are the light emitting portions configured to emit light on the basis of the information different from the identification information (identification numbers) as described above. The information different from the identification information is, for example, a command that is generated according to a situation in a video game being executed, and is transmitted from the information processing apparatus 90 executing the game program. As illustrated in FIG. 22B, the control apparatus 91 of the information processing apparatus 90 includes a game processing unit 91b as its function. When executing the game program, the game processing unit 91b generates a moving image as a result of the execution, displays the moving image on a display apparatus, which is not illustrated, and transmits, to the input device 10, a light emission command for the second light emitting portions E2. On receipt of the light emission command, the input device 10 causes the second light emitting portions E2 to emit light. The input device 10 drives a second light source S2 (see FIG. 20) corresponding to the second light emitting portions E2. The second light source S2 may include, for example, a plurality of light emitting diodes (LEDs) of different emission colors so as to be able to emit light of any color. That is, emission states of the second light emitting portions E2 are controlled on the basis of control information for the input device 10 generated by an application program being executed by the information processing apparatus 90, depending on a state of the application program. Thus, the second light emitting portions E2 of the input device 10 at the hands of the user can be caused to emit light with a color and a timing suitable for an effect produced in the application being executed in synchronization with a status of an image displayed or sound output by the application. Further, another example of the information different from the identification information is information associated with a state of the input device 10. The input device 10 may monitor a connection state between the input device 10 and the information processing apparatus 90 or a state of charge of the battery, for example, and cause the second light emitting portions E2 to emit light on the basis of control information generated by the input device 10 itself according to the monitored state. Further, the information associated with the state of the input device 10 may be light emission control information for the second light emitting portions E2 that is generated according to the state of the input device 10 monitored by the system software of the information processing apparatus 90 and is transmitted to the input device 10.

As illustrated in FIG. 19, the first light emitting portions E1 and the second light emitting portions E2 are provided in the light emitting region Es along the outer edge of the input member 20 (center region). Thus, visibility of both the first light emitting portions E1 configured to indicate the identification information and the second light emitting portions E2 configured to indicate the information different from the identification information can be enhanced.

The light emitting region Es surrounds the outer edge of the input member 20. As illustrated in FIG. 19, in the example of the input device 10, the light emitting region Es extends along left, rear, and right edges of the input member 20. Thus, the light emitting portions E1 and E2 can be flexibly positioned. Unlike the example of the input device 10, the light emitting region Es may be formed along left, front, and right edges of the input member 20, or may be formed along the four edges (left, rear, right, and front edges) of the input member 20.

As illustrated in FIG. 19, the plurality of first light emitting portions E1 may be arranged in line along the rear edge of the input member 20. With this, the user can easily grasp an identification number indicated by the first light emitting portions E1. The width of the input member 20 in the left-right direction may be larger than the width thereof in the forward-rearward direction. Thus, the rear edge of the input member 20 is longer than the right and left edges of the input member 20. Thus, an interval between adjacent two first light emitting portions E1 can be easily secured.

As illustrated in FIG. 19, the second light emitting portions E2 may be provided along the left and right edges of the input member 20. With this, the outer edge of the input member 20 is surrounded by the light emitting portions E1 and E2, so that the visibility of the light emitting portions E1 and E2 can be enhanced, and the appearance of the input device 10 can also be enhanced.

Note that, the arrangement of the light emitting portions E1 and E2 is not limited to the example in the input device 10. For example, the plurality of first light emitting portions E1 may be disposed along each of the left and right edges of the input member 20, and the second light emitting portion E2 may be disposed along the rear edge of the input member 20.

As illustrated in FIG. 20, the first light sources S1 configured to cause the first light emitting portions E1 to emit light are provided to the input member 20. More specifically, the first light sources S1 are mounted on the circuit board 22 of the input member 20. The plurality of first light sources S1 are arranged along a rear edge of the circuit board 22 (see FIG. 19). The first light sources S1 each include an LED. The first light source S1 may be a monochrome LED, or may include a plurality of LEDs of different emission colors so as to be able to emit light of any color. The frame 24 of the input member 20 has through holes 24a at positions corresponding to the first light sources S1. Light from the first light source S1 passes through the through hole 24a to enter the light diffusing member 71 to illuminate the light diffusing member 71. This illuminated portion is the first light emitting portion E1.

Figure 21A:
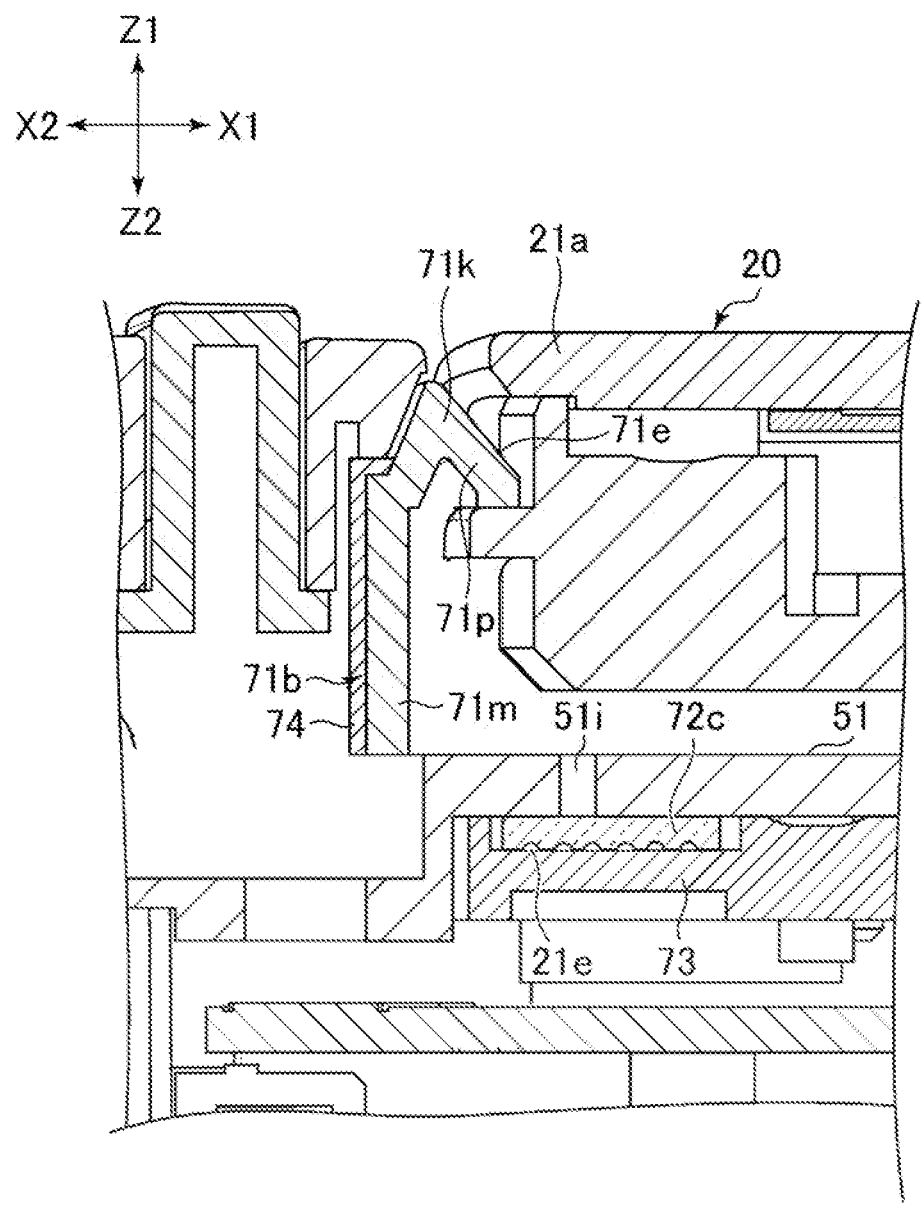
FIG. 21A is a sectional view taken along line XXI-XXI illustrated in FIG. 1A.

Meanwhile, the second light source S2 configured to cause the second light emitting portions E2 to emit light is mounted on the circuit board 61 below and away from the input member 20 as illustrated in FIG. 20. Light from the second light source S2 is guided to left and right side portions 71b of the light diffusing member 71 through a light guide member 72. The second light source S2 is disposed at a center of the circuit board 61 in the left-right direction. As illustrated in FIG. 2 and FIG. 20, the light guide member 72 has, at its rear edge, an incident surface 72a positioned in front of the second light source S2. The light guide member 72 has a right light guide portion 72b extending in a forward right direction from the incident surface 72a, and a left light guide portion 72c extending in a forward left direction from the incident surface 72a. As illustrated in FIG. 21A, front portions of the left and right light guide portions 72c and 72b are positioned below the left and right side portions 71b of the light diffusing member 71. Light from the left and right light guide portions 72c and 72b enter the side portions 71b of the light diffusing member 71 to illuminate the side portions 71b. Thus, the side portions 71b function as the second light emitting portions E2.

With the use of the light guide member 72, the second light emitting portions E2 provided along the left and right edges of the input member 20 can be caused to emit light by the single second light source S2, and the number of parts of the input device 10 can thus be reduced.

As illustrated in FIG. 2 and FIG. 21A, the front portions of the left and right light guide portions 72c and 72b are supported by a reflection member 73. The reflection member 73 is disposed under the light guide portions 72c and 72b, and reflects light from lower sides of the light guide portions 72c and 72b upward. Lower surfaces of the light guide portions 72c and 72b may have a plurality of recessed portions 21e (see FIG. 21A) for reflecting light travelling through the light guide portions 72c and 72b upward.

As illustrated in FIG. 21A, the frame 51 is disposed on upper sides of the light guide portions 72c and 72b. The frame 51 has through holes 51i. Light from the upper sides of the light guide portions 72c and 72b passes through the through holes 51i to enter the side portions 71b of the light diffusing member 71 disposed on the upper side of the frame 51.

In this way, in the input device 10, the light sources S1 and S2 are separately attached to the circuit board 22 of the input member 20 and the circuit board 61. Thus, the light sources S1 and S2 can be more flexibly positioned, with the result that the light emitting portions E1 and E2 can be flexibly positioned.

Note that, the arrangement of the light sources S1 and S2 is not limited to the example in the input device 10. For example, in a case where the first light emitting portions E1 are provided along the left and right edges of the input member 20, the first light sources S1 may be mounted on left and right edges of the circuit board 22 of the input member 20. In this case, the second light source S2 may be disposed along the rear edge of the circuit board 22.

[Light Diffusing Member]

As illustrated in FIG. 2, the light diffusing member 71 has a rectangular frame shape and surrounds the outer edge of the input member 20. The light diffusing member 71 has a rear portion 71a disposed along the rear edge of the input member 20, the side portions 71b disposed along the left and right edges of the input member 20, and a front portion 71c disposed along the front edge of the input member 20. The light diffusing member 71 is integrally formed from a resin, for example. The light diffusing member 71 is a member configured to internally diffuse incident light and emit the light from a wide range of the light diffusing member 71.

A shape of the light diffusing member 71 is not limited to the above-mentioned one. The light diffusing member 71 may not have the front portion 71c, for example. Further, the light diffusing member 71 may not be integrally formed. For example, the left and right side portions 71b of the light diffusing member 71 may be separately molded.

Figure 21B:
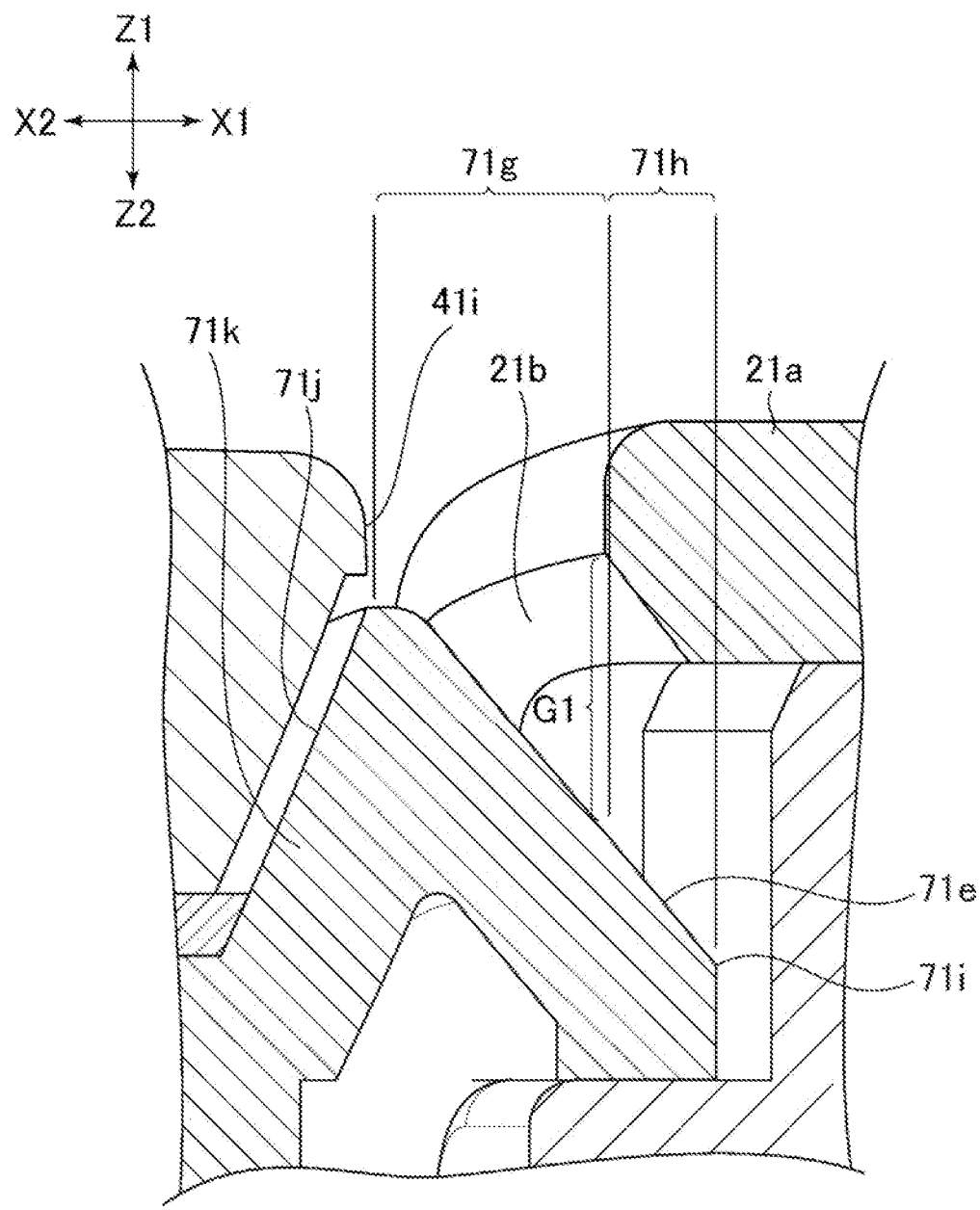
FIG. 21B is an enlarged view of FIG. 21A.

As illustrated in FIG. 21B, the side portion 71b of the light diffusing member 71 has a light emitting surface 71e that emits light. The left and right side portions 71b each have the light emitting surface 71e. The light emitting surface 71e has a first region 71g exposed in a gap between an inner edge 41i of the opening 41h formed in the upper cabinet section 41 and the outer edge of the input member 20, and a second region 71h positioned on the inner side of the outer edge of the input member 20 and below a peripheral portion 21a of the input member 20. With this structure, an area (width) of the light emitting surface 71e can be increased without enlarging the gap between the inner edge 41i of the opening 41h of the upper cabinet section 41 and the outer edge of the input member 20. As a result, the light emitting surface 71e can be made conspicuous, and the appearance of the input device 10 can be further enhanced.

As illustrated in FIG. 21B, a gap G1 is preferably formed between the light emitting surface 71e and the outer edge of the input member 20 in the upward-downward direction. With this, the user easily sees a lower edge 71i of the light emitting surface 71e. Further, the gap G1 allows the input member 20 to move in the upward-downward direction. Thus, the input member 20 can function as the press button.

As illustrated in FIG. 21B, an upper portion 71k of the light diffusing member 71 has a slope 71j facing the inner edge of the opening 41h of the upper cabinet section 41. The gap G1 between the light emitting surface 71e and the outer edge of the input member 20 is larger than a gap between the slope 71j and the inner edge of the opening 41h.

As illustrated in FIG. 21B, a top portion of the side portion 71b of the light diffusing member 71 (an upper edge of the light emitting surface 71e) is lower than the upper surface of the input member 20 (an upper surface of the surface panel 21). Further, the top portion of the side portion 71b is lower than an upper surface of the upper cabinet section 41. Thus, a groove is formed between the outer edge of the input member 20 and the inner edge 41i of the opening 41h of the upper cabinet section 41. The input member 20 is surrounded by this groove.

As illustrated in FIG. 21B, the light emitting surface 71e tilts in the first region 71g and the second region 71h to extend downward toward the inner side of the outer edge of the input member 20. Thus, the user can see the lower edge 71i of the light emitting surface 71e by tilting the input device 10.

As illustrated in FIG. 21B, the peripheral portion 21a of the input member 20 may have a slope 21b facing the tilted light emitting surface 71e. With this, the user easily sees the lower edge 71i of the light emitting surface 71e.

The light diffusing member 71 has the upper portion 71k having the light emitting surface 71e and a wall portion 71m extending downward from the upper portion 71k. The wall portion 71m extends downward beyond a lower surface of the frame 24 of the input member 20, reaching the frame 51 having the circuit board 61 and the like attached thereto. Light that has passed through the through hole 51i of the frame 51 enters the wall portion 71m, thereby illuminating the light emitting surface 71e of the light diffusing member 71. Note that, a light-shielding member 74 may be provided on an exterior surface of the wall portion 71m. The light-shielding member 74 can prevent light from leaking from unintentional positions. A reflection member may be provided on the wall portion 71m instead of the light-shielding member 74 or in addition to the light-shielding member 74.

As described above, the input member 20 is movable in the upward-downward direction and functions as the button. Meanwhile, the light diffusing member 71 is fixed to the upper cabinet section 41. Thus, when the input member 20 is pressed, the light emitting surface 71e does not move. With this, for example, an effect that the input member 20 moves in the upward-downward direction in the light can be provided.

As illustrated in FIG. 2, the light diffusing member 71 has attached portions 71n laterally extending from the side portions 71b, for example. The attached portions 71n are attached to a lower surface of the upper cabinet section 41 with fixtures, for example, screws. The attachment structure of the light diffusing member 71 is not limited to the example in the input device 10. The light diffusing member 71 may be attached to the frame 51.

As illustrated in FIG. 21A, the upper portion 71k of the side portion 71b of the light diffusing member 71 has an inner wall portion 71p having the light emitting surface 71e and extending obliquely downward from a top portion of the upper portion 71k. The frame 24 of the input member 20 has stopped portions 24b laterally protruding. A lower edge of the inner wall portion 71p is positioned on an upper side of the stopped portion 24b to function as a stopper portion configured to prevent the input member 20 from coming out upward. By using the light diffusing member 71 as the stopper portion in this way, the number of parts can be reduced.

As illustrated in FIG. 20, the rear portion 71a of the light diffusing member 71 may also have a projected portion 71r that functions as a stopper portion. The projected portion 71r is engaged with a rear edge of the frame 24 to regulate the upward motion of the input member 20.

As illustrated in FIG. 20, the front portion 71c of the light diffusing member 71 is positioned in front of the input member 20. In more detail, the front portion 71c is positioned in front of the frame 24 of the input member 20. With this, the front portion 71c of the light diffusing member 71 functions as a stopper configured to prevent the input member 20 from coming out forward.

In the example of the input device 10, the front portion 71c of the light diffusing member 71 is exposed forward through a gap between a front edge 21f of the input member 20 and an edge of the cabinet 40 (an upper edge 42d of the lower cabinet section 42). Light entering the side portions 71b of the light diffusing member 71 may be diffused inside the light diffusing member 71 to illuminate the front portion 71c.

CONCLUSION

As described above, the input device 10 includes the cabinet 40 including the upper cabinet section 41 and the lower cabinet section 42 that are combined in the upward-downward direction, the screws 49b fixing the upper cabinet section 41 to the lower cabinet section 42, and the cover 45 attached to the exterior surface of the cabinet 40 to cover the screws 49b. The exterior surface of the cabinet 40 has the exposed region adjacent to the cover side portions 45L and 45R and not covered by the cover 45. The step N is formed between the exposed region of the exterior surface of the cabinet 40 and the exterior surfaces of the cover side portions 45L and 45R, and the exterior surface of the cover 45 is recessed compared to the exposed region of the exterior surface of the cabinet 40. With this input device, the screws 49b are covered by the cover 45, so that the appearance of the input device 10 can be enhanced. Further, since the exterior surface of the cover 45 is recessed compared to the exterior surface of the cabinet 40, the observer looking at the input device 10 hardly recognizes the cover 45 as a cover. Thus, the appearance of the input device 10 can be further enhanced.

Further, the input device 10 includes the left held section 10L serving as the left portion of the input device 10, the right held section 10R serving as the right portion of the input device 10, the cabinet 40 including the upper cabinet section 41 and the lower cabinet section 42 that are combined in the upward-downward direction, the screws 49b fixing the upper cabinet section 41 to the lower cabinet section 42, and the cover 45 attached to the exterior surface of the cabinet 40 to cover the screws (fixtures) 49b. The screws 49b are provided to the respective left and right held sections 10L and 10R. The cover 45 includes the fixture cover 45a covering the screw 49b in the right held section 10R, the fixture cover 45a covering the screw 49b in the left held section 10L, and the center portion 45M connecting the left and right fixture covers 45a. With the input device 10, the screws 49b are covered by the cover 45, so that the appearance of the input device 10 can be enhanced. Further, with the input device 10, the number of parts can be reduced.

The input device 10 includes the first microphone 8A, the cabinet 40 accommodating the first microphone 8A, the first sound hole V1 formed in the cabinet 40 and connected to the first microphone 8A, and the input buttons 35, the directional pad 19, and the like serving as the input members that the user operates with his/her fingers. The exterior surface of the cabinet 40 (the exterior surface of the lower cabinet section 42) has one or a plurality of wall portions (the inner surface of the protection recessed portion 42f or a side surface of the protection projected portion 42h) surrounding the first sound hole V1. With the input device 10, a possibility that the opening edge of the first sound hole V1 is entirely covered by the fingers is reduced, and noise due to the fingers in contact with the first sound hole V1 can thus be reduced.

Further, the input device 10 includes the cabinet 40 having the openings 43a, the input sticks 31 movable inside the openings, and the buffer members 46. The buffer members 46 are each provided to one of the inner edge of the opening 43a and the outer peripheral surface of the input stick 31, and is made of a material different from the material of the inner edge of the opening 43a and the material of the outer peripheral surface of the input stick 31. With the input device 10, noise generation in voice data that is acquired by the microphones 8A and 8B can be suppressed.

Further, the input device 10 includes the upper cabinet section 41 having the openings, the input buttons 35 positioned inside the openings and movable in the upward-downward direction, the switches 36a made of an elastic material and configured to bias the input buttons 35 toward their initial positions, and the buffer member 37. The input buttons 35 each have the stopped portions 35b and 35c configured to prevent the input button 35 from popping out of the opening. The buffer member 37 is made of a material different from the material of the upper cabinet section 41 and the material of the input button 35, and has the stopper portions 37a and 37b positioned between the inner edge of the opening of the upper cabinet section 41 and the stopped portions 35b and 35c of the input button 35. With the input device 10, noise generation due to operation sound from the input buttons 35 in voice data that is acquired by the microphones 8A and 8B can be effectively suppressed.

Further, in the input device 10, the dampers 68 are disposed between the circuit board 61 and the frame 51. With the input device 10, noise generation in voice data that is acquired by the microphones 8A and 8B can be suppressed.

The input member 20 is disposed in the center region of the upper surface of the input device 10. The upper surface of the input device 10 has the light emitting region Es formed along the outer edge of the input member 20. The light emitting region has the first light emitting portions E1 configured to indicate the identification information assigned to the plurality of input devices 10 connected to the information processing apparatus, and the second light emitting portions E2 configured to emit light on the basis of the information different from the identification information. With this, the visibility of the first light emitting portions E1 and the second light emitting portions E2 can be enhanced.

The input device 10 includes the upper cabinet section 41 having the opening, the input member 20 that is disposed inside the opening and has the upper surface to be touched by the user with his/her fingers, and the light diffusing member 71 disposed along the outer edge of the input member 20 and having the light emitting surface 71e. The light emitting surface 71e has the first region 71g exposed through the gap between the inner edge of the opening of the upper cabinet section 41 and the outer edge of the input member 20, and the second region 71h positioned on the inner side of the outer edge of the input member 20 and below the peripheral portion 21a of the input member 20. With this, the conspicuity of the light emitting surface 71e can be enhanced without changing the gap between the outer edge of the input member 20 and the inner edge of the opening 41h, and the appearance of the input device 10 can be further enhanced.

It should be understood by those skilled in the art that various modifications, combinations, sub-combinations and alterations may occur depending on design requirements and other factors insofar as they are within the scope of the appended claims or the equivalents thereof.

What is claimed is:

1. An input device comprising:
    a cabinet including an upper cabinet section and a lower cabinet section that are combined in an upward-downward direction;
    at least one fixture fixing the upper cabinet section to the lower cabinet section; and
    a cover attached to an exterior surface of the cabinet to cover the at least one fixture,
    wherein the exterior surface of the cabinet has an exposed region adjacent to the cover and not covered by the cover, and
    a step is formed between the exposed region of the exterior surface of the cabinet and an exterior surface of the cover, so that the exterior surface of the cover is recessed with respect to the exposed region of the exterior surface of the cabinet.

2. The input device according to claim 1, wherein the at least one fixture includes a plurality of fixtures fixing the upper cabinet section to the lower cabinet section, and the cover covers the plurality of fixtures.

3. The input device according to claim 1, further comprising:
    a left held section on which an input member that is operated with a finger is disposed and which serves as a left portion of the input device; and
    a right held section on which an input member that is operated with a finger is disposed and which serves as a right portion of the input device,
    wherein the at least one fixture includes a fixture provided to the left held section and a fixture provided to the right held section, and
    the cover has a cover side portion covering the fixture provided to the left held section, a cover side portion covering the fixture provided to the right held section, and a cover center portion connecting the left and right cover side portions.

4. The input device according to claim 1, further comprising:
    a left held section on which an input member that is operated with a finger is disposed, the left held section serving as a left portion of the input device and including a left grip; and
    a right held section on which an input member that is operated with a finger is disposed, the right held section serving as a right portion of the input device and including a right grip,
    wherein the cover has a cover side portion provided to the left held section and a cover side portion provided to the right held section,
    each of the cover side portions is positioned in a substantially center region in a left-right direction of the input device, in an exterior surface of corresponding one of the left grip and the right grip, and
    the exposed region of the cabinet includes an outer side region in the left-right direction of the input device, in the exterior surface of each of the left grip and the right grip.

5. The input device according to claim 1, wherein
    a first step is formed at a first position on a boundary between the exterior surface of the cabinet and the exterior surface of the cover,
    a second step is formed at a second position on the boundary, and
    the second step is smaller in height than the first step.

6. The input device according to claim 1, further comprising:
    an input stick,
    wherein the cover has an opening inside which the input stick is disposed.

7. The input device according to claim 1, further comprising:
    a grip,
    wherein the cover has a cover side portion disposed along a side surface of the grip, and a portion that is bent with respect to the cover side portion to be positioned at a rear edge of the grip and covers the at least one fixture.

8. An input device comprising:
    a left held section on which an input member that is operated with a finger is disposed and which serves as a left portion of the input device;
    a right held section on which an input member that is operated with a finger is disposed and which serves as a right portion of the input device;
    a cabinet including an upper cabinet section and a lower cabinet section that are combined in an upward-downward direction, and a section forming the left held section and the right held section;
    at least one fixture fixing the upper cabinet section to the lower cabinet section; and
    a cover attached to an exterior surface of the cabinet to cover the at least one fixture,
    wherein the at least one fixture is provided to each of the left held section and the right held section, and
    the cover has a left cover side portion covering the fixture in the left held section, a right cover side portion covering the fixture in the right held section, and a cover center portion connecting the left cover side portion and the right cover side portion.

9. A cover capable to be attached on an exterior surface of a cabinet,
    the cabinet having
    a left held section which serves as a left portion of an input device and on which an input member is disposed, the input member being for operation with a finger;

a right held section which serves as a right portion of the input device and on which an input member is disposed, the input member being for operation with a finger, and an upper cabinet section and a lower cabinet section that are combined in an upward-downward direction, each of the left and right held sections having at least one fixture that fixes the upper and lower cabinet sections to each other, the cover comprising a left cover side portion covering for the fixture in the left held section, a right cover side portion for covering the fixture in the right held section, and a cover center portion connecting the left and right cover side portions.

10. The cover according to claim 9, further comprising an opening inside which an input stick of the input device is disposed, the opening being formed on the cover center portion.

11. The cover according to claim 9, wherein each of the left and right cover side portions is disposed along a side surface of a grip of the input device, and the cover further comprises a portion being bent with respect to the left and right cover side portions, being positioned at a rear edge of the grip of the input device, and covering the at least one fixture.

12. An input device comprising:
a cabinet including an upper cabinet section and a lower cabinet section that are combined in an upward-downward direction;
an input member; and
a cover attached to an exterior surface of the cabinet,
wherein the exterior surface of the cabinet has an exposed region adjacent to the cover and not covered by the cover,
a step is formed between the exposed region of the exterior surface of the cabinet and an exterior surface of the cover, so that the exterior surface of the cover is recessed with respect to the exposed region of the exterior surface of the cabinet, and
the cover has an opening inside which the input stick is disposed.

13. A cover capable to be attached on an exterior surface of a cabinet of an input device having a left held section which serves as a left portion of an input device and on which an input member is disposed and a right held section which serves as a right portion of the input device and on which an input member is disposed, the cover comprising:
a left cover side portion located in the left held section and attached on the exterior surface of the cabinet,
a right cover side portion located in the right held section and attached on the exterior surface of the cabinet, and
a cover center portion connecting the left cover side portion and the right cover side portion, and having an opening formed therein for putting an input member inside the opening.

* * * * *